US009602022B2

(12) United States Patent
Cheng

(10) Patent No.: US 9,602,022 B2
(45) Date of Patent: Mar. 21, 2017

(54) ELECTRICAL DEVICE FOR USE WITH A MULTIWAY SWITCH SYSTEM

(71) Applicant: Winston Cheng, El Cerrito, CA (US)

(72) Inventor: Winston Cheng, El Cerrito, CA (US)

(*) Notice: Subject to any disclaimer, the term of this patent is extended or adjusted under 35 U.S.C. 154(b) by 383 days.

(21) Appl. No.: 14/086,915

(22) Filed: Nov. 21, 2013

(65) Prior Publication Data

US 2015/0138860 A1    May 21, 2015

(51) Int. Cl.
*H02M 7/32* (2006.01)
*H03K 17/96* (2006.01)
*H02M 7/04* (2006.01)
*H05B 37/02* (2006.01)

(52) U.S. Cl.
CPC .............. *H02M 7/32* (2013.01); *H02M 7/04* (2013.01); *H03K 17/962* (2013.01); *H05B 37/0272* (2013.01)

(58) Field of Classification Search
CPC ........ H02M 7/04; H02M 7/32; H03K 17/962; H05B 37/0272
See application file for complete search history.

(56) References Cited

U.S. PATENT DOCUMENTS

| | | | |
|---|---|---|---|
| 7,656,308 B2* | 2/2010 | Atkins | G08C 17/02 315/312 |
| 7,772,724 B2* | 8/2010 | Mosebrook | H05B 37/0209 307/139 |
| 2011/0032070 A1* | 2/2011 | Bleile | H05B 37/0272 340/3.51 |

* cited by examiner

*Primary Examiner* — Matthew Nguyen
(74) *Attorney, Agent, or Firm* — Vedder Price, P.C.

(57) ABSTRACT

Electrical devices, methods of operating an electrical device for use with a multiway switch system, and methods for connecting an electrical device with a load device and a multiway switch system for controlling the load device are described. In one embodiment, an electrical device for use with a multiway switch system includes an alternating current (AC) power interface configured to connect to at least one of a live wire and a neutral wire of an AC power supply, a load regulator module configured to regulate a load device that is connected to the neutral wire of the AC power supply, an output power interface configured to connect to the multiway switch system and to output a voltage to a switch of the multiway switch system, and a microcontroller module configured to control the load regulator module in response to a switching of the multiway switch system.

17 Claims, 13 Drawing Sheets

ELECTRICAL DEVICE FOR USE WITH A MULTIWAY SWITCH SYSTEM

CROSS-REFERENCE TO RELATED APPLICATION

This application relates to U.S. patent application Ser. No. 13/863,189, filed Apr. 15, 2013, which is incorporated herein by reference.

FIELD OF THE INVENTION

Embodiments of the invention relate generally to electronic hardware and methods, and, more particularly, to electrical devices, methods of operating electrical devices, and methods of connecting electrical devices with switches.

BACKGROUND OF THE INVENTION

Multiway switches can be used to control load devices, such as lights or electrical fans, in multiple locations. Conventionally, a load device to be controlled is directly connected between multiway switches. However, the shorting of the multiway switches can lead to the shorting of the load device, which in turn, can cause systematic electricity overload. For example, the shorting of the multiway switches can burn a safety fuse of an electricity meter that is connected to the load device or destroy the electricity meter.

SUMMARY OF THE INVENTION

Electrical devices, methods of operating an electrical device for use with a multiway switch system, and methods for connecting an electrical device with a load device and a multiway switch system for controlling the load device are described. In one embodiment, an electrical device for use with a multiway switch system includes an alternating current (AC) power interface configured to connect to at least one of a live wire and a neutral wire of an AC power supply, a load regulator module configured to regulate a load device that is connected to the neutral wire of the AC power supply, an output power interface configured to connect to the multiway switch system and to output a voltage to a switch of the multiway switch system, and a microcontroller module configured to control the load regulator module in response to a switching of the multiway switch system. The electrical device can monitor its connections with the multiway switch system and stop or start the supplying of AC power to the load device when one of the switches in the multiway switch system is toggled. Compared to a conventional electrical system in which a load device is directly connected between multiway switches, the electrical device serves as an intermediary that insulates the load device from the multiway switches. Consequently, if a switch shorts, the electrical device can shield the load device from the short and prevent damage to the load device and an electricity meter of the AC power supply. Other embodiments are also described.

In one embodiment, an electrical device for use with a multiway switch system includes an AC power interface configured to connect to at least one of a live wire and a neutral wire of an AC power supply, a load regulator module configured to regulate a load device that is connected to the neutral wire of the AC power supply, an output power interface configured to connect to the multiway switch system and to output a voltage to a switch of the multiway switch system, and a microcontroller module configured to control the load regulator module in response to a switching of the multiway switch system.

In one embodiment, an electrical device for use with a multiway switch system and configured to fit within an electrical gang/patress box includes a housing, an AC power interface configured to connect to at least one of a live wire and a neutral wire of an AC power supply, an AC to direct current (DC) transformer within the housing configured to transform an AC power signal from the AC power interface into a DC power signal, a load regulator module within the housing configured to regulate a load device in response to the AC power signal or the DC power signal, an output power interface that is accessible from outside the housing, and a microcontroller module within the housing configured to control the load regulator module in response to a switching of the multiway switch system and to implement wireless communications. The AC power interface is accessible from outside the housing. The load device is connected to the neutral wire of the AC power supply. The output power interface is configured to connect to the multiway switch system and to output a voltage to a switch of the multiway switch system. The multiway switch system is connected to the live wire of the AC power supply.

In one embodiment, a method of operating an electrical device that is installed within an electrical gang/patress box for use with a multiway switch system involves monitoring an output power interface of the electrical device to detect a switching of a switch of the multiway switch system and controlling a load regulator module of the electrical device to cause AC power to be supplied to a load device or cut off from the load device in response to detection of the switching of the switch of the multiway switch system.

In one embodiment, a method for connecting an electrical device with a load device and a multiway switch system for controlling the load device involves connecting an AC power interface of the electrical device to at least one of a live wire and a neutral wire of an AC power supply, connecting the load device to the neutral wire of the AC power supply, connecting an output power interface of the electrical device to the multiway switch system, and connecting the multiway switch system to the live wire of the AC power supply.

Other aspects and advantages of embodiments of the present invention will become apparent from the following detailed description, taken in conjunction with the accompanying drawings, depicted by way of example of the principles of the invention.

BRIEF DESCRIPTION OF THE DRAWINGS

Throughout the description, similar reference numbers may be used to identify similar elements.

DETAILED DESCRIPTION OF THE INVENTION

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
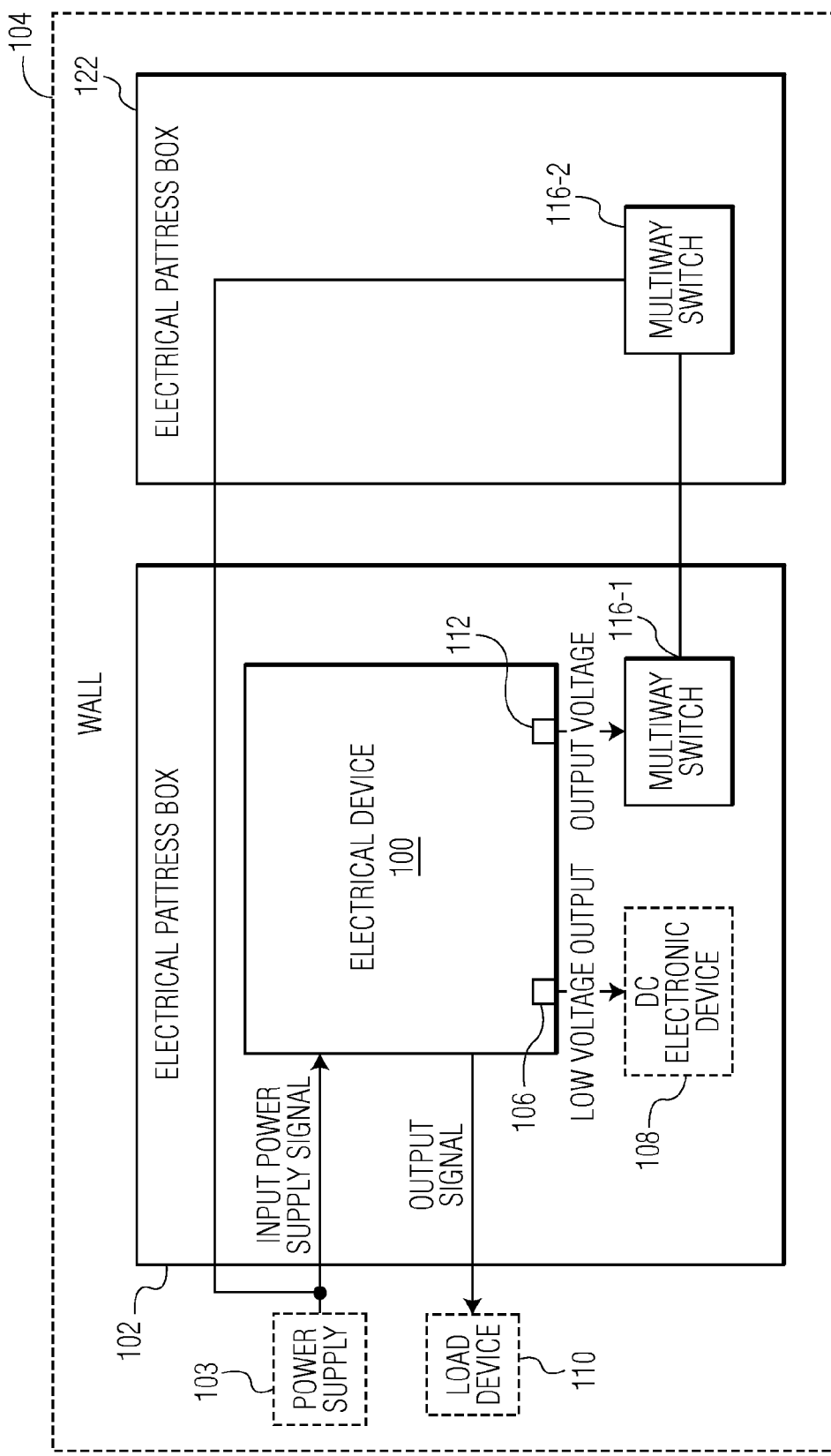
FIG. 1 is a schematic block diagram of an electrical device in accordance with an embodiment of the invention.

FIG. 1 is a schematic block diagram of an electrical device 100 in accordance with an embodiment of the invention. The electrical device may be used for various applications. In an embodiment, the electrical device is an in-wall device that has a form factor that fits within a standard gang/patress box. In some embodiments, the electrical device 100 is installed in an electrical gang/patress box 102 that is mounted on the surface of a wall 102 or mounted within the wall. As is known in the art, a gang box or a patress or pattress box is a container for the space behind electrical fittings, such as, one or more power outlets, switches, dimmers, touch panels, thermostats, and security keypads. A patress box is made in standard dimensions and is mounted on the surface of the wall or embedded into the wall. A patress box is usually made of metal and/or plastic.

In the embodiment depicted in FIG. 1, the electrical device 100 receives a power supply input signal from a power supply 103 and generates a power supply output signal, which is outputted to a load device 110. The power supply may be any type of power supply. In some embodiments, the power supply is an AC power supply and the input signal is an AC power signal that is accessible from within the electrical patress box. For example, the power supply is typically the power provided within a residential or commercial building. In these embodiments, the input signal and the output signal are AC power signals. In some embodiments, the electrical device 100 includes one or more power supply interfaces that interface with the power supply 103. The load device 110 can be any suitable type of electrical load, such as a capacitive load, a resistive load, and/or an inductive load. For example, the load device 110 may be a light, a fan, an electronic wall outlet, or a window covering.

The electrical device 100 can be used as a retrofit solution to use with a building's existing multiway switches without modifying existing wirings. In the embodiment depicted in FIG. 1, the electrical device 100 outputs an output voltage to a first multiway switch 116-1 that is installed in the same electrical gang/patress box 102 through a connector 112. A second multiway switch 116-2, which is installed in a different electrical gang/patress box 122 (e.g., at a different end of a stairway or hallway), is connected to the first multiway switch 116-1 and to the power supply 103 and the electrical device 100. The multiway switches 116-1, 116-2 and the electrical device 100 form a closed circuit. Consequently, the electrical device 100 can monitor its connection with the multiway switches 116-1, 116-2 to detect the toggling of one of the multiway switches 116-1, 116-2. In some embodiments, the output voltage to the multiway switch 116-1 has the same voltage as the power supply input signal from the power supply 103. For example, the power supply input signal and the output voltage to the multiway switch 116-1 are AC power signals with identical voltages.

Multiway switches are used to control an electrical load (e.g., the load device 110) from multiple locations (e.g., either end of a stairway, a long hallway, or a large room). Connecting two multiway switches together and toggling either switch can change the on/off state of an electrical load. Multiway switches allows an electrical load, such as, a lamp, an electrical outlet, a fan, a pump, or a heater, that is located in a hallway, a stairwell, or a large room, to be controlled from different locations. For example, three-way (3-way) or four-way (4-way) switches can be used to control a light from multiple locations, such as the top and the bottom of a stairway, both ends of a hallway, or multiple doorways into a room. In one embodiment, a multiway switch is a three-way switch, which is a single-pole, double-throw (SPDT) switch. In another embodiment, a multiway switch is a four-way switch, which is a double-pole, double-throw (DPDT) switch with two pairs of electrical terminals.

In an embodiment, the electrical device 100 looks for state change caused by the switching of the multiway switches 116-1, 116-2 and controls the load device 110 via an internal control circuit, such as a relay switch or a Triode for Alternating Current (TRIAC) circuit. For example, the electrical device 100 may include a built-in electronically controllable relay switch or a TRIAC circuit that is used to control a capacitive load, a resistive load, and/or an inductive load (e.g., a light, a fan, an electronic wall outlet, or a window covering).

In some embodiments, in addition to the output voltage to the multiway switch 116-1, the electrical device 100 outputs a low-voltage DC output through a connector 106. A low-voltage DC electronic device 108, such as a touch panel, can be powered directly by the low-voltage output without needing an AC transformer or battery. Examples of the low-voltage DC electronic device 108 include, without limitation, switches, dimmers, touch panels, thermostats, and security keypads. For example, the electronic device 108 may be a wall mounted switch, a dimmer, and/or a touch panel for controlling the load device 110. In some embodiments, the electrical device 100 may be used as a connection to the power supply 103 for replacing a building's existing wall switch with the low-voltage DC electronic device. The low-voltage DC output signal has a voltage that is lower than the voltage of the input power supply signal to a low-voltage DC electronic device 108. In some embodiments, the low-voltage output signal has a voltage of less than a voltage threshold of about 36V, for example, within ±10% of 36V. In an embodiment, the low-voltage output signal has a voltage of around 3.3 Volts (V), for example, within ±10% of 3.3V. Although example voltages (36V and 3.3V) of the low-voltage output signal are provided, the voltage of the low-voltage output signal can be at any suitable value that is deemed to be "low-voltage" and is not limited to the examples provided.

Each of the connectors 106, 112 may include one or more Input/Output (I/O) pins, I/O ports, or I/O sockets for connection with, for example, electric wires or signal cables. In some embodiments, the connector 106 or 112 includes one or more power supply interfaces that interface with the DC electronic device 108 or the multiway switch 116-1. The connector 106 or 112 may be located within or on a surface of the housing of the electrical device 100. In some embodiments, the electrical device 100 includes more than two connectors.

Figure 2:
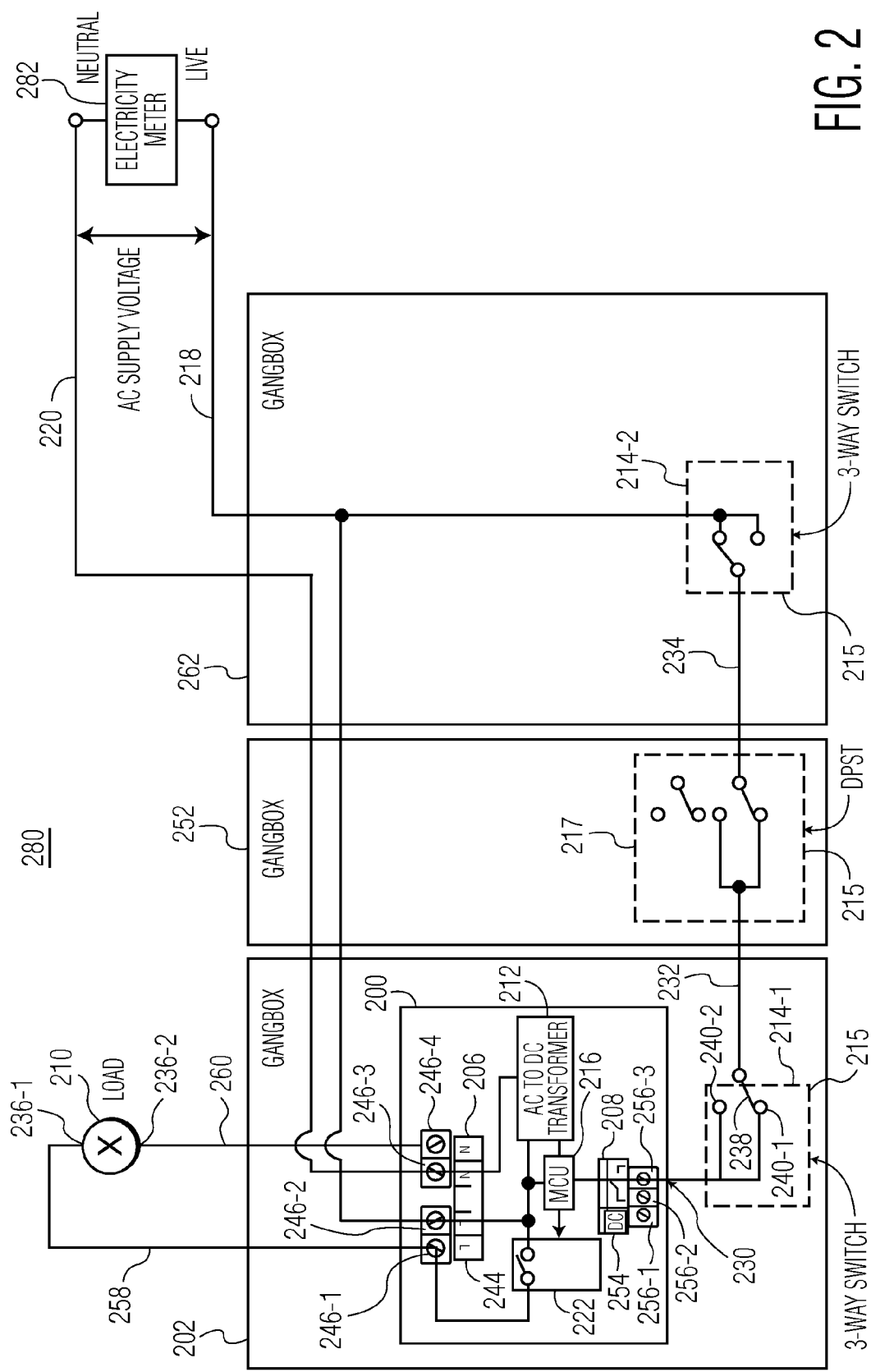
FIG. 2 depicts an embodiment of the electrical device depicted in FIG. 1.

FIG. 2 depicts an embodiment of the electrical device 100 depicted in FIG. 1 that is used with a multiway switch system 215 that includes first and second 3-way switches 214-1, 214-2 and a DPST 217. In the embodiment depicted in FIG. 2, the electrical device 200 of an electrical system 280 includes an AC power interface 206, an output power interface 208, an AC to DC transformer 212, a microcontroller unit (MCU) module 216, and a switch module 222. The electrical device 200 and the first 3-way switch 214-1 are installed in an electrical gang/patress box 202. The DPST 217 is installed in an electrical gang/patress box 252 and the second 3-way switch 214-2 is installed in an electrical gang/patress box 262. For example, the electrical gang/patress boxes 202, 252, 262 can be installed at different sections of a stairway, a long hallway, or a large room. The electrical gang/patress boxes 202, 252, 262 are similar as or the same as the electrical gang/patress box 102. The electrical device 200 depicted in FIG. 2 is one possible embodiment of the electrical device 100 depicted in FIG. 1. However, the electrical device 100 is not limited to the embodiment depicted in FIG. 2. Circuit elements that can be included in the electrical device 200 are not limited to the components depicted in FIG. 2. For example, the electrical device 200 may include at least one additional component, such as an energy meter module, a Radio Frequency (RF) transceiver module, an antenna, and/or an internal button in some cases. In an embodiment, the electrical device 200 does not have wireless communications capability. In an embodiment, the electrical device 200 includes an energy meter module that is configured to measure energy consumption of a load device of the electrical device 200. The energy meter module can measure the energy consumption of the load device in wattage, voltage, current, and kilowatt hour (kWh). In an embodiment, the energy meter module reports or transmits the energy consumption parameters to the MCU module 216. Although the two 3-way switches and the DPST are used with the electrical device 200 in the embodiment depicted in FIG. 2, in other embodiments, a different combination of multiway switches are used with the electrical device 200.

The electrical device 200 receives an AC input signal through the AC power interface 206 and outputs an AC output signal for powering a load device 210, which is similar to or the same as the load device 110. The electrical device 200 also outputs a voltage signal to the 3-way switch 214-1 through the output power interface 208. In some embodiments, the electrical device 200 also generates a low-voltage DC signal that is inputted into a low-voltage DC electronic device, such as a touch panel.

In the embodiment depicted in FIG. 2, the electrical device is connected to the first 3-way switch 214-1 through a live wire 230 and outputs an AC power signal to the first 3-way switch 214-1 through the live wire 230. The first 3-way switch 214-1 is serially connected to the DPST 217 and the second a-way switch 214-2 through live wires 232, 234. The second 3-way switch 214-2 is connected to a first terminal 236-1 of the load device 210 through the electrical device 200. A neutral wire 260 is connected to a second terminal 236-2 of the load device 210. As is known in the art, a neutral wire has a voltage potential of zero (i.e., the ground) while a live wire has a voltage potential that is equal to the AC supply voltage. Toggling one of the two 3-way switches 214-1, 214-2 and the DPST 217 (i.e., placing a movable switch contact/arm in a position that is not connected to any stationary switch contact) causes an electrical disconnection between the electrical device 200 and the multiway switch system 215, which triggers the MCU module 216 to control the switch module 222. For example, when a movable switch contact (throw) 238 of the first 3-way switch 214-1 is moved from a first stationary contact (pole) 240-1 to a second stationary contact (pole) 240-2. In the moment of switching, the poles of a three-way switch are not connected to the throw of the three-way switch, and consequently, a high voltage is produced at the output power interface 208. After the moment of switching, a pole of the three-way switch is connected to the throw of the three-way switch, and consequently, the voltage at the output power interface 208 is back to a low normal level. In addition, in the moment of switching, the current flow between the 3-way switch 214-1 and the electrical device 200 dips (e.g., to zero) for a moment. The MCU module 216 senses the voltage changes and/or the current dip at the output power interface 208 and switches the switch module 222 accordingly. Compared to a conventional electrical system in which a load device is directly connected between multiway switches, the electrical device 200 serves as an intermediary that insulates the load device 210 from the multiway switch system 215. Consequently, in the event of an electrical shorting in the multiway switch system 215, the electrical device 200 can shield the load device 210 from being shorted, prevent damage to the load device 210, and avoid a systematic electricity overload in the electrical system 280, which can burn a safety of an electricity meter 282 of the electrical system 280 or destroy the expensive electricity meter 282 of the electrical system 280.

The power interface 206 or 208 may include one or more I/O pins, ports, or sockets. In the embodiment depicted in FIG. 2, each power interface 206 or 208 is a screw-type power interface that includes at least one screw and at least one wire socket controllable by the at least one screw. However, power interfaces of the electrical device 200 are not limited to the examples described herein. In other embodiments, other types of power interfaces, such as non-screw types of power interfaces, may be used. In addition, although the power interfaces are depicted in FIG. 2 as including certain numbers of sockets, in other embodiments, the number of sockets included in the power interfaces may be different from the number of sockets as depicted in FIG. 2.

The AC power interface 206 includes a label 244 and four sockets 246-1, 246-2, 246-3, 246-4 that are located underneath corresponding screws and are marked by the label 244. The sockets 246-1, 246-2, 246-3, 246-4 are used to connect power cables/wires. Adjusting the screws can cause the power cables to be connected or disconnected from the electrical device 200. In the embodiment depicted in FIG. 2, AC power is carried by a neutral wire 220 and a live wire 218. In an embodiment, the neutral wire 220 is connected to the socket 246-3 and the live wire 218 is connected to the socket 246-2. The load device 210 is connected to the sockets 246-1, 246-4. The load device 210 is connected to the socket 246-1 via a live wire 258. The sockets 246-3, 246-4, which are labeled as "N," and "Load N," are connected to each other. Consequently, the load device 210 is connected to the socket 246-4 via the neutral wire 260. The electrical device 200, the live wire 258, the load device 210, and the neutral wire 260 can form a closed circuit. Consequently, the electrical device 200 can control the power that is supplied to the load device 210.

The output power interface 208, which is an embodiment of the connectors 106, 112 depicted in FIG. 2, includes a label 254 and three sockets 256-1, 256-2, 256-3 that are located underneath corresponding screws and are marked by the label 254. The sockets 256-1, 256-2, 256-3 are used to connect power cables/wires. Adjusting the screws can cause the power cables to be connected or disconnected from the electrical device 200. An AC power signal or a DC power signal can be output to the 3-way switch 214-1 via the socket 256-2 or 256-3, which is labeled by a switch symbol. In an embodiment, the output signal may be an AC power signal that is delivered to the 3-way switch 214-1 via a live wire 230. The electrical device 200, the live wire 230, the multiway switch system 215 and the live wire 218 can form a closed circuit. Consequently, the switching of the two 3-way switches 214-1, 214-2 and the DPST can affect the operation of the electrical device 200 and trigger a response from the electrical device 200.

The AC to DC transformer 212 of the electrical device 200 is configured to transform an AC input signal, which is carried by the neutral wire 220 and the live wire 218, into a low DC voltage for other components of the electrical device 200. In the embodiment depicted in FIG. 2, the AC to DC transformer 212 uses a three-wire design that requires a neutral connection. In some embodiments, the AC to DC transformer 212 uses a 2-wire connection with no neutral link. The AC to DC transformer can work with standard voltages in various countries and regions, including North America, Europe, Middle East, Central America and the Caribbean, South America, Africa, Australia and Oceania. In an embodiment, the AC to DC transformer can transform an input AC voltage of 110V/60 Hz or 230V or 240V/50 Hz or 60 Hz into a suitable low DC voltage. For example, the AC to DC transformer can transform an AC power input voltage of around 120V to an internal DC voltage of 5V or any suitable value.

The switch module 222 of the electrical device 200 is configured to control the load device 210, for example, to dim the load device 210, (e.g., reduce the supplied power to the load device 210), or turn on/off the load device 210. The dimming of a load is not limited to reducing or increasing the light intensity of an electric light. In an embodiment, the switch module 222 speeds up or speeds down an electric fan. The switch module can dim or turn on/off the load device 210 under the control of the MCU module 216. The switch module 222 may include a relay switch, a Triode for Alternating Current (TRIAC) circuit, or any other suitable switching component that is known in the art.

The MCU module 216 of the electrical device 200 is configured to control other components of the electrical device 200 (e.g., the switch module 222, the AC power interface 206, and/or the output power interface 208). The MCU module can control the switch module, the AC power interface 206, and/or the output power interface 208 in response to the DC voltage signal from the AC to DC transformer 212. The MCU module, which can be implemented in the form of a microcontroller, may be powered by the AC to DC transformer 212.

In an embodiment, the MCU module 216 outputs an AC power signal to the 3-way switch 214-1 through the socket 256-2 or 256-3 and a live wire 230. The voltage of the AC output power signal may be the same or similar to the voltage of the AC input power signal that is inputted into the electrical device 200 through the live wire 218. In some embodiments, the voltage of the AC power input signal and the voltage of the output signal from the socket 256-2 or 256-3 are around 120V (e.g., within ±10% of 120V) or around 230V (e.g., within ±10% of 230V). Although an example voltage of the AC output signal is provided, the voltage of the AC output signal can be at any suitable value and is not limited to the example provided.

Figure 3:
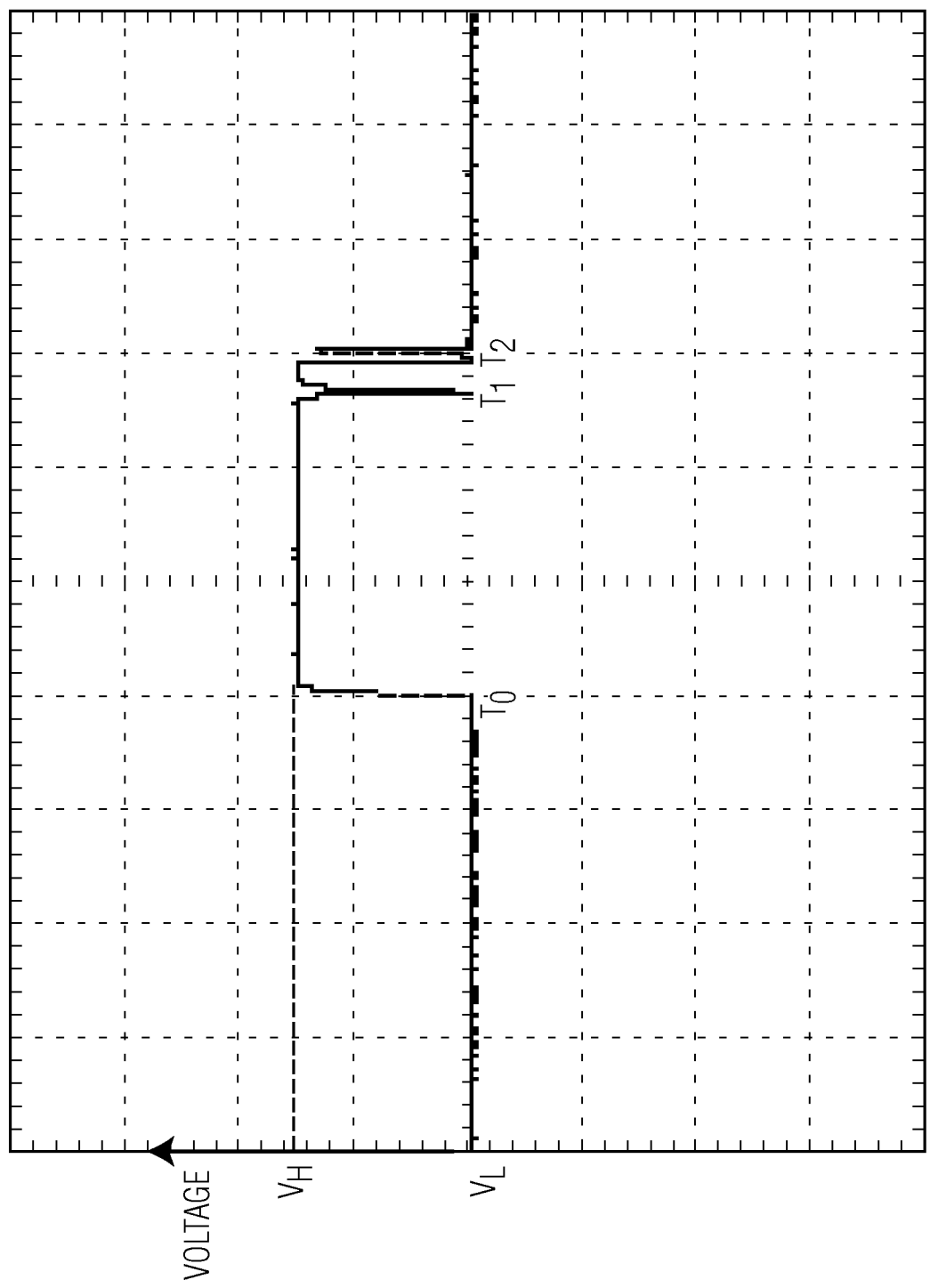
FIG. 3 is an exemplary voltage waveform diagram of the electrical device depicted in FIG. 2.

When one of the two 3-way switches 214-1, 214-2 and the DPST 217 is toggled, a movable switch contact (throw) of the active switch is moved from a first stationary contact (pole) to a second stationary contact (pole). In the moment of switching, the poles of the active switch are not connected to any throw of the active switch, and consequently, a high voltage is produced at the output power interface 208. After the moment of switching, a pole of the active switch is connected to a throw of the active switch, and consequently, the voltage at the output power interface 208 is back to a low normal level. In some embodiments, the MCU module 216 senses the voltage changes at the output power interface 208 and switches the switch module 222 accordingly. FIG. 3 is an exemplary waveform diagram of the voltage at the output power interface 208 around switch events. The waveform between time points, "$T_0$," and "$T_2$," is caused by a toggling of one of the switches 214-1, 214-2, 217. Twice rise edges and twice fall edges are caused by an active switch's mechanical jitter. In the moment of switching, the poles of the active switch are not connected to any throw of the active switch. Consequently, a high level voltage is produced at the output power interface 208 and the waveform rises from a low voltage, "$V_L$," to a high voltage, "$V_H$." Because of the mechanical jitter of the active switch, the voltage waveform briefly dips back to the low voltage, "$V_L$," at time point $T_1$. Immediately after time point $T_1$, the waveform returns to the high voltage, "$V_H$." After the moment of switching, a pole of the active switch is connected to a throw of the active switch, and consequently, the waveform decreases from the high voltage, "$V_H$," to the low voltage, "$V_L$," at time point $T_2$. The MCU module 216 detects the sudden rise (e.g., the rising edge) and the sudden dip (e.g., the falling edge) of the voltage waveform and causes the switch module 222 to switch on/off and start/stop the supply of the AC power to the load device 210.

The MCU module 216 may use a software routine to implement the monitoring of the waveform and the notification of the switch module 222. The software routine may be stored in a memory module that is accessible by the MCU module. An example of a software routine that can be used in the MCU module 216 is provided as follows. However, the implementation of the software routine that can be used in the MCU module 216 is not limited to the example provided.

```
void ButtonInterrupt( ) interrupt INUM_INT0
{
EX0 = 0;   //Close the interrupt during processing
if((portMode==PORT_MODE_3WAYSWITCH) &&(!ExDisableTime))
// if 3WAYSWITCH mode is enabled and anti-jitter counter is zero
    {
    Way3KeyFlag = 1; //detect 3way switching, execute main loop
    ApplicationPoll
    }
      ExDisableTime=40;   //reset anti-jitter counter
      EX0 = 1;              //Open the interrupt after processing
    }
Void msPoll( )
{
    If(ExDisableTime)    //if anti-jitter counter is non-zero
       ExDisableTime--; //deduct anti-jitter counter by one
}
Void ApplicationPoll( )
{
   If(Way3KeyFlag)      //if 3way switching is detected
   {
     PIN_TOGGL (P0_1); //invert pin status e.g., on->off,off->on
     Way3KeyFlag=0;   //reset 3way switching flag
   }
}
```

The above software routine includes a ButtonInterrupt function, a msPoll function and an ApplicationPoll function. The ButtonInterrupt function can be trigged by a rising edge on an I/O pin of the MCU module 216. If the 3WAY-SWITCH mode is enabled in the MCU module 216 and an anti jitter counter is zero, the ApplicationPoll function is executed and a switching status indicator I/O pin of the MCU module 216 is inverted. The msPoll function is executed periodically (e.g., every millisecond) to adjust the status of the anti jitter counter.

When one of the two 3-way switches 214-1, 214-2 and the DPST 217 is toggled, the electrical connection between the output power interface 208 and the electrical device 200 becomes open. When the electrical connection between the output power interface 208 and the electrical device 200 becomes open, the current that flows between the output power interface 208 and the multiway switch system 215 abruptly stops. In some embodiments, the MCU module 216 detects the change in the current that flows between the output power interface 208 and the multiway switch system 215 and triggers the switching on/off of the switch module 222 in response to the current change.

Turning back to FIG. 2, in some embodiments, the MCU module 216 outputs a low-voltage DC output signal via the socket 256-1 that is labeled as, "DC," to power a low-voltage DC device. A low-voltage DC device, such as a touch panel, can be powered directly by the low-voltage output without needing an AC transformer or battery. The voltage of the low-voltage DC output signal is lower than the voltage of the AC input power signal that is carried by the neutral wire 220 and the live wire 218. In some embodiments, the voltage of the AC power input signal is around 120V (e.g., within ±10% of 120V) or around 230V (e.g., within ±10% of 230V), and the voltage of the low-voltage DC output signal is around 3.3V (e.g., within ±10% of 3.3V). Although an example voltage (3.3V) of the low-voltage DC output signal is provided, the voltage of the low-voltage DC output signal can be at any suitable value and is not limited to the example provided.

In some embodiments, the MCU module 216 includes an RF transceiver unit configured to communicate with other RF devices through an antenna. The RF transceiver unit can operate in various licensed and unlicensed RF frequency bands. In some embodiments, the RF transceiver unit can operation in a frequency band of around 908.42 MegaHertz (MHz) (e.g., within ±10% of 908.42 MHz) in the United States and/or in a frequency band of around 868.42 MHz (e.g., within ±10% of 868.42 MHz) in Europe. To reduce power consumption and reduce interference with other appliances, the communication range of the RF transceiver unit is generally limited. For example, the RF transceiver unit may have a range of around 15 meters (e.g., within ±10% of 15 meters). The RF transceiver unit may be compatible with various wireless communications standards, depending upon applications in which the electrical device 200 is used for. In some embodiments, the electrical device 200 is used for home automation, for example, as a retrofit solution for wireless home automation, and the RF transceiver unit is compatible with home automation communications protocols. In some embodiments, the MCU module 216 conducts wireless communications in a manner that is compatible with Z-Wave wireless mesh communications protocol, Wifi, Zigbee, and/or Bluetooth. Although some examples of wireless communications protocols/standards are described, the MCU module 216 can conduct wireless communication in any suitable wireless communications protocol/standard or any combination of suitable wireless communications protocols/standards. In some embodiments, the MCU module 216 conducts wireless communication in a low data rate wireless communications protocol. As is known in the art, Z-Wave is a wireless communications protocol designed for home automation. Z-Wave was originally developed by Zen-Sys. Z-Wave technology can be used in home electronics devices and systems, such as residential and commercial lighting, home access control, entertainment systems and household appliances, for remote control applications. The Z-Wave wireless mesh communications protocol can be used to provide a mesh network for commands to hop from node to node for reliability. The Z-Wave wireless mesh communications protocol is optimized for reliable, low-latency communication of small data packets. Compared with Wi-Fi and other IEEE 802.11-based wireless Local Area Network (LAN) systems that are designed primarily for high data rate communications, the Z-Wave wireless mesh communications protocol is designed for a low data rate that offers reliable data delivery along with simplicity and flexibility. The Z-Wave wireless mesh communications protocol works in an industrial, scientific, and medical (ISM) band around 900 MHz. In these embodiments, the electrical device 200 can act as a low-cost z-wave energy meter and an appliance switch/controller. Specifically, the electrical device 200 can be used to enable z-wave command and control (e.g., on/off) for in-wall switches, dimmers, and/or touch panels. The on/off control can be done via z-wave communications, manual wall switch and/or a built-in button on the electrical device 200. The electrical device 200 can also be used to report immediate wattage consumption or kilowatt hour (kWh) energy usage over a period of time. The electrical device 200 can communicate with products that are Z-Wave compatible or certified devices, such as appliances, lighting controllers, and/or Z-Wave handheld remote. The electrical device 200 can also act as a repeater in the Z-Wave mesh network. Acting as a bridge for communication, the electrical device 200 can forward Z-Wave command messages to intended destinations.

In some embodiments, the MCU module 216 includes a non-volatile memory unit. In the event of power failure, the non-volatile memory retains all programmed information relating to the operating status of the electrical device 200. Alternatively, the non-volatile memory may be separate from the MCU module.

Although the electrical device 200 is shown as including certain components, in some embodiments, the electrical device 200 includes less or more components to implement less or more functionalities. In some embodiments, the electrical device 200 includes an energy meter module that is configured to measure energy consumption of the load device 210. The energy meter module can measure the energy consumption of the load device 210 in wattage, voltage, current, and kilowatt hour (kWh). The energy meter module can report or transmit the energy consumption parameters to the MCU module 216. In some embodiments, the electrical device 200 has a physical button configured to receive a user input for controlling the electrical device 200. In some embodiments, the physical button is used to control the MCU module to dim, turn on, or turn off the load 210. In some embodiments, the physical button is located on a major surface of the electrical device 200 and can be activated by a user. For example, an electrician or a home owner can apply physical force to the physical button to control the electrical device 200. The electrical device 200 may include a status indication light-emitting diode (LED) (not shown in FIG. 2) and pressing the physical button can cause the LED to blink accordingly, indicating an operating status of the electrical device 200.

Figure 4:
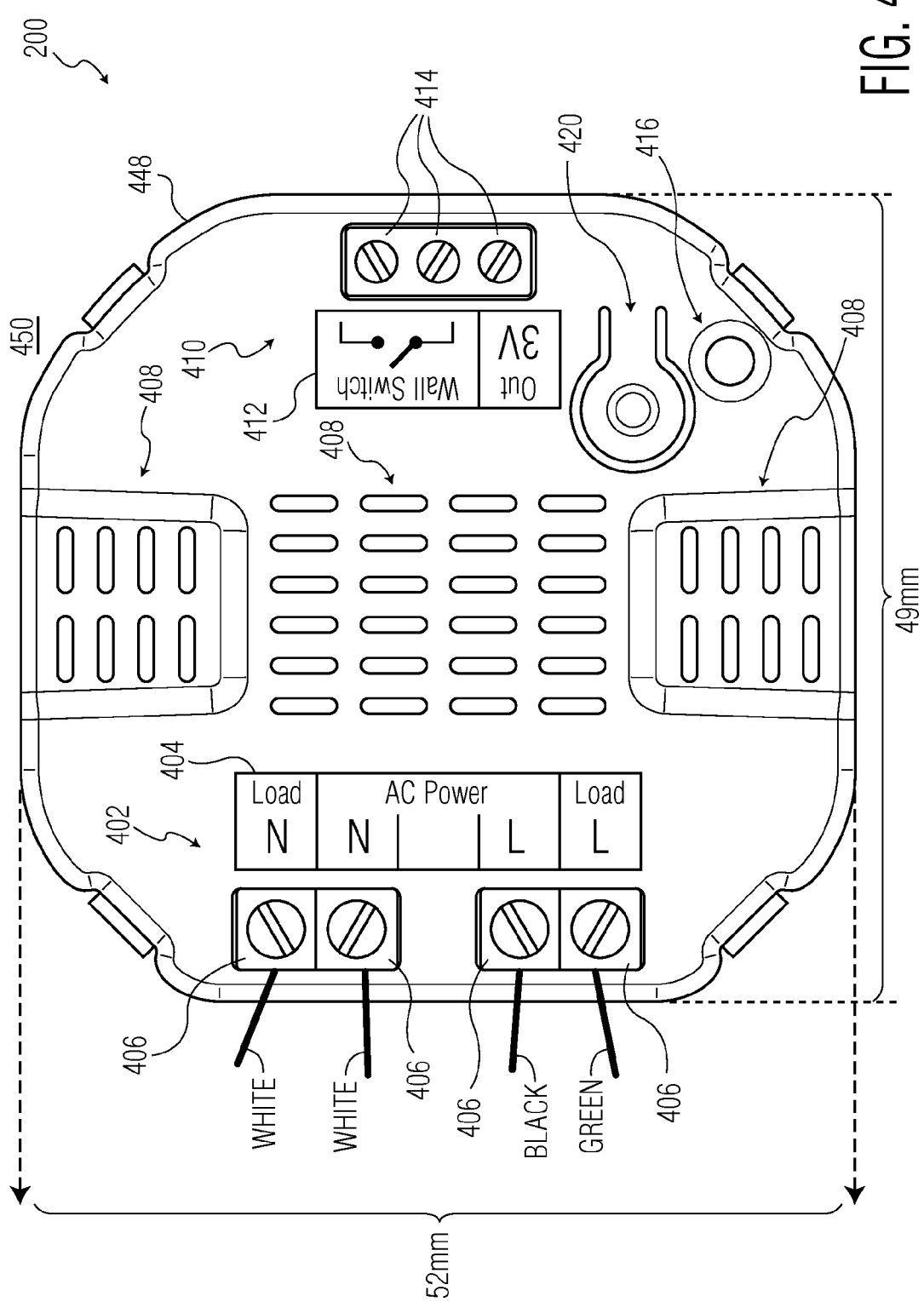
FIG. 4 shows a two-dimensional top view of the electrical device depicted in FIG. 2 in accordance with an embodiment of the invention.
Figure 5:
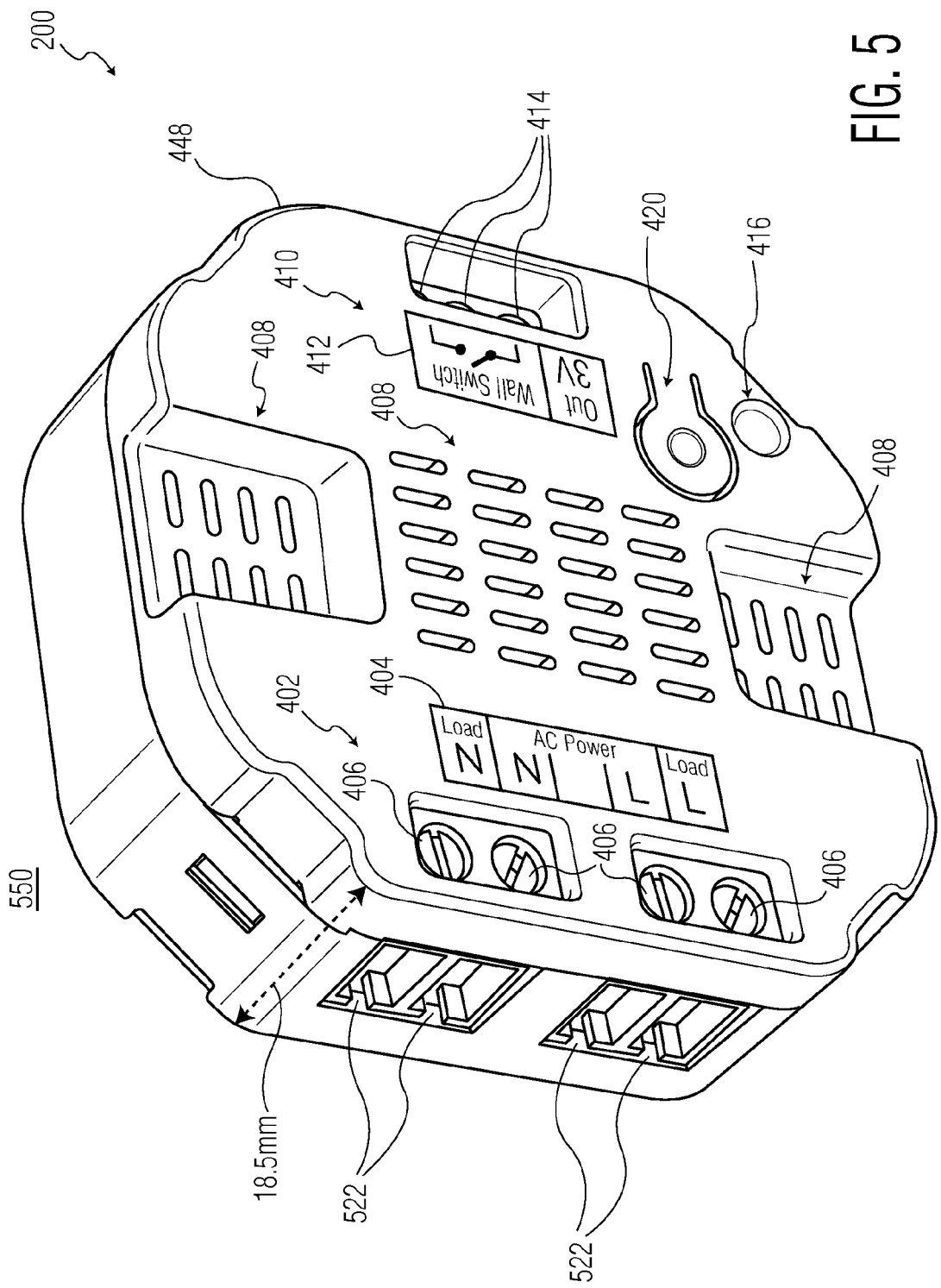
FIG. 5 shows a perspective top view of the electrical device depicted in FIG. 2 that corresponds to the two-dimensional top view shown in FIG. 4.

FIG. 4 shows a two-dimensional top view 450 of the electrical device 200 in accordance with an embodiment of the invention while FIG. 5 shows a perspective top view 550 of the electrical device 200 that corresponds to the two-dimensional top view shown in FIG. 4. In the embodiment depicted in FIG. 4, the housing 448 of the electrical device 200 can be made of plastic and/or metal, or any other suitable material. The top view 450 shows the housing 448, an AC power interface 402, thermal dissipation openings 408 used for the thermal dissipation of the electrical device 200, an output power interface 410, an LED 418, and a button 420. Some components of the electrical device 200 shown in FIG. 2, such as the AC to DC transformer 212, the MCU module 216, and the switch module 222, are hosted within the housing 408 of the electrical device 200 and, consequently, are not shown in FIGS. 4 and 5.

The AC power interface 402 is an embodiment of the AC power interface 206 while the output power interface 410 is an embodiment of the output power interface 208. In the embodiments depicted in FIGS. 4 and 5, each of the AC power interface 402 and the output power interface 410 is a screw-type power interface that includes at least one screw and at least one wire socket controllable by the at least one screw. The AC power interface 402 includes a label 404 and four screws 406 that are marked by a label 404. Four sockets (not shown in FIG. 4) are located underneath the four screws 406 and are connected to power wires/cables. Adjusting the screws 406 can cause the power cables to be connected or disconnected from the electrical device 200. Although the electrical device 200 is shown in the top view 450 as being connected to electric wires in white, black, and green, in other embodiments, electric wires in other colors are used. The output power interface 410 includes a label 412 and three screws 414 that are marked by a label 412. Three sockets (not shown in FIG. 4) are located underneath the three screws 414 and are connected to power cables (not shown in FIG. 4). Adjusting the screws 414 can cause the power cables to be connected or disconnected from the electrical device 200. The three sockets controlled by the three screws 414 are used to output a low-voltage DC output and/or an AC output. For example, for a wall-mountable light switch, two sockets that are controlled by the screws 414 under the label, "Wall Switch," are used to connect wires between the light switch and the electrical device 200. In another example, the socket under the label, "Out 3V," may have a voltage of around 3.3 Volts (V), for example, within ±10% of 3.3V. Although an example voltage (3.3V) is provided, the voltage of the sockets controlled by the three screws 414 can be at any suitable value and is not limited to the example provided. FIG. 5 shows a three-dimensional top view 550 of the electrical device 200 that corresponds to the two-dimensional top view 450 shown in FIG. 4. The three-dimensional top view 550 shows four sockets 522 controllable by the screws 406.

Turning back to FIG. 4, the LED 418 is used to indicate the working status of the electrical device 200. The button 420 is a physical button on the surface of the electrical device 200. A user, such as an electrician or a home owner, can apply physical force to the button 420 to control the electrical device 200. For example, pressing of the button can cause the LED 418 to blink accordingly, indicating the operating status of the electrical device 200.

In the embodiment depicted in FIGS. 4 and 5, the electrical device 200 has a small form factor that fits within most gang/patress boxes worldwide. In some embodiments, the dimension of the electrical device 200 is between 60×49×20 millimeters (mm) and 25×25×10 mm. For example, the electrical device 200 may have a dimension of 52×49×18.5 mm (as labeled in FIGS. 4 and 5), which is smaller than the dimensions of standard gang/patress boxes. For example, a standard gang box typically has a dimension of 2.375×4.5× 1.5-2.5 (1.5-2.5 is the range of the depth) inches and a standard pattress box typically has a dimension of 86×86× 30-44 (30-44 is the range of the depth) mm. Consequently, the electrical device 200 can fit within most gang/patress boxes worldwide. Although some examples of the dimension of the electrical device 200 are provided, the dimension of the electrical device 200 is not limited to the examples shown in FIGS. 4 and 5. The dimension of the electrical device 200 can be set to any suitable value.

Figure 6:
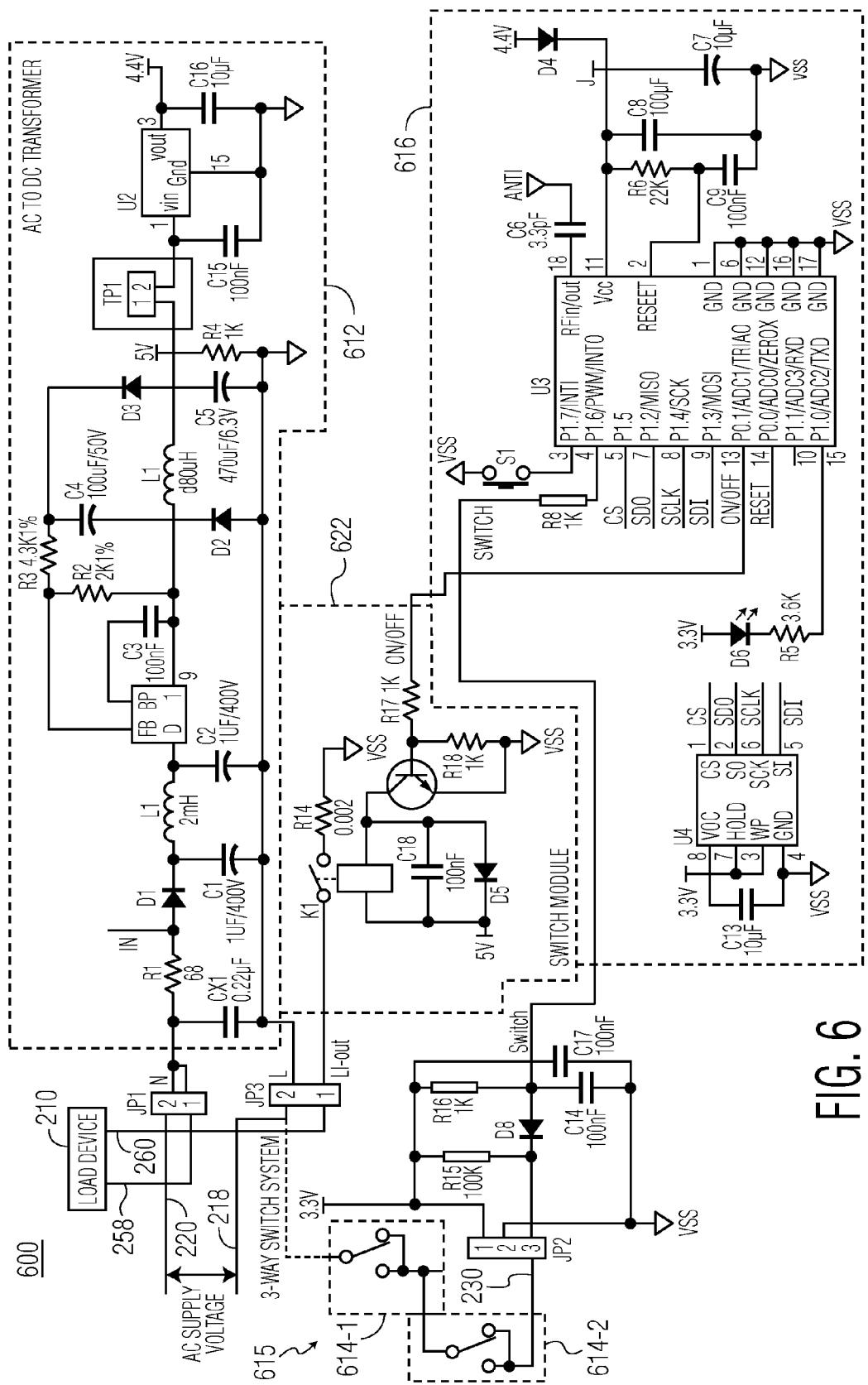
FIG. 6 depicts an embodiment of the electrical device depicted in FIG. 2.

FIG. 6 depicts an embodiment of the electrical device 200 depicted in FIG. 2 that is used with a 3-way switch system 615 that includes 3-way switches 614-1, 614-2. In the embodiment depicted in FIG. 6, an electrical device 600 includes connectors "JP1," "JP2," and "JP3," an I/O circuit 610, an AC to DC transformer 612, a MCU module 616, and a switch module 622. The electrical device 600 depicted in FIG. 6 is one possible embodiment of the electrical device 200 depicted in FIG. 2. However, the electrical device 200 is not limited to the embodiment depicted in FIG. 6. For example, circuit elements that can be included in the electrical device 600 are not limited to the components depicted in FIG. 6. The electrical device 200 may include at least one additional component, such as an energy meter module, a RF transceiver module, an antenna, and/or an internal button.

The I/O connectors, "JP1," "JP3," are an embodiment of the AC power interface 206 depicted in FIG. 2 while the I/O connector, "JP2," is an embodiment of the output power interface 208 depicted in FIG. 2. The I/O connectors, "JP1," "JP3," are connected to an AC power supply through the live wire 218 and the neutral wire 220 and are connected to the load device 210 through the live wire 258 and the neutral wire 260.

In the embodiment depicted in FIG. 6, the AC to DC transformer 612 includes resistors, "R1," "R2," "R3," "R4," capacitors, "CX1," "C1," "C2," "C3," "C4," "C5," "C15," "C16," inductors, "L1," "L2," diodes, "D1," "D2," "D3," a connector, "TP1," a latch, "U1," and a controller, "U2." The capacitors, "CX1," "C3," "C15," "C16," have fixed capacitances while the capacitors, "C1," "C2," "C4," "C5," are variable capacitors. In some embodiments, the capacitors, "CX1," "C3," "C15," "C16," have capacitances of 0.22 µF, 100 nF, 100 nF, and 10 µF, respectively, while the capacitors, "C1," "C2," "C4," "C5," have capacitances of 1 µF at 400V, 1 µF at 400V, 10 µF at 50V, and 470 µF at 6.3V, respectively. In some embodiments, the resistors, "R1," "R2," "R3," "R4," have resistances of 47 or 68 ohm (a), 2,000Ω, 4,300Ω, 1,000Ω, respectively. In some embodiments, the inductors, "L1," "L2," have inductances of 2 mH and 680 µH. Although some examples of the electrical parameters of the circuit elements of the AC to DC transformer 612 are described, the electrical parameters of the circuit elements of the AC to DC transformer 612 can be set to any suitable values.

The AC to DC transformer 612 is connected to the I/O connectors, "JP1," "JP3," to receive AC input power signals and to supply output AC power signals to the load device 210. In the embodiment depicted in FIG. 6, the connector, "JP1," is connected to the neutral (N) wires 220, 260 while the connector, "JP3," is connected to the live (L) wire 218 via a pin or a port "JP3_2." The capacitors, "CX1," "C1," "C2," "C5," "C15," "C16," the resistor, "R4," and the diode, "D1," are connected in parallel with the capacitor, "CX1." The resistor, "R4," capacitors, "CX1," "C1," "C2," "C5," "C15," "C16," the diode, "D2," and the controller, "U1," are connected to the live wire 218 via the pin "JP3_2," and a voltage, "Vss." Consequently, the voltage, "Vss," of the AC to DC transformer 612 is the same as the AC voltage that is carried by the live wire 218. An input signal, "IN," is inputted to a node, "N1," between the resistor, "R1," and the diode, "D1." The input signal, "IN" is used to get AC main voltage for generating zero cross signal, which is used to generate a fire pulse (Triode for Alternating Current (TRIAC) signal) for every half period. That is, both the rising edge and the falling edge are used as a time base for generating the fire pulse. In some embodiments, the input signal, "IN," is used for the dimmer version of the electrical device 600 (e.g., the switch module 622 acts as a dimmer) and is not used for the switch/relay version of the electrical device 600 (e.g., the switch module 622 acts as a switch). The resistor, "R1," is located between the AC main line and the input signal, "IN," and acts as an insurance resistance (e.g., with a resistance of only 47 or 68 ohms). The voltage of the input signal, "IN," may be nearly the same as the voltage of the AC main line. A fixed voltage, such as 5V, is applied to the resistor, "R4." A low DC output voltage is outputted from the capacitor, "C16." In some embodiments, the AC to DC transformer 312 transforms an AC voltage of between 85V and 200V to a low DC output voltage of around 4.4V. Although some examples of the voltages of the AC to DC transformer 612 are described, the input and output voltages of the AC to DC transformer 612 are not limited to the described examples.

The switch module 622 is connected to the load device 210 via a pin or a port "JP3_1," of the connector, "JP3," and the MCU module 616. In the embodiment depicted in FIG. 6, the switch module 622 includes a relay, "K1," resistors, "R14," "R17," "R18," a capacitor, "C18," a diode, "D5," and a transistor, "Q1." The resistors, "R14," "R18," and the transistor, "Q1," are connected to the voltage, "Vss." Although the switch module 622 is implemented as a relay circuit in FIG. 6, in other embodiments, the switch module 622 may be implemented by other types of electronic switches. For example, the switch module 622 may be implemented as a TRIAC-gated switch.

The connector, "JP3," is connected to the I/O circuit 610 and a 3-way switch 614-2 via the live wire 230. The I/O circuit includes resistors, "R15," "R16," capacitors, "C14," "C17," and a diode, "D8." The capacitors, "C14," "C17," and a pin or port, "JP2_2," of the connector, "JP2," are connected to the voltage, "Vss."

The MCU module 616 is connected to the switch module 622, the connector, "JP2," through the I/O circuit 610, and the voltage output of the AC to DC transformer 612. In the embodiment depicted in FIG. 6, the MCU module 616 includes resistors, "R5," "R6," "R8," capacitors, "C6," "C7," "C8," "C9," "C13," diodes, "D4," "D6," a controller, "U3," and a storage unit, "U4." A pin, "P0.1" of the controller, "U3" is connected to the switch module 622. A pin, "P1.6" of the controller, "U3" is connected to the 3-way switch system 615 through the I/O circuit 610 and the connector, "JP3." The MCU module 616 depicted in FIG. 6 is one of possible embodiments of the MCU module 216 depicted in FIG. 2. However, the MCU module 216 is not limited to the embodiment depicted in FIG. 6.

An example of the operation of the MCU module 616 is described as follows. When the 3-way switch 614-1 or 614-2 is toggled, the connection between the pin/port, "JP2_3," and the live wire/line 230 is cut off momentarily. Because the pin, "P1.6" of the controller, "U3" is connected to the 3-way switch system 615 through the I/O circuit 610 and the connector, "JP3," the voltage and/or current waveform at the pin, "P1.6" changes in response to the electricity cut-off. In an embodiment, the falling edge of the voltage and/or current waveform at the pin, "P1.6" triggers an interrupt and an interrupt handler is activated to process the 3-way switch event. The controller, "U3," turns on or turns off the pin, "P0.1," to control the relay, "K1," of the switch module 622 such that power can be supplied to the load device 210 or cut off from the load device 210 accordingly.

In the embodiment depicted in FIG. 6, the voltage, "Vss," is the same as the voltage of the live wire 218 that is used to carry the AC power signal from an AC power supply that is accessible from within an electrical patress box. For example, the AC power supply is typically the power provided within a residential or commercial building. In other words, the "ground" of the electrical device 600 is the live wire 218. Consequently, the AC power connection's neutral/live/ground are used for the switching detection of the 3-way switch system 615. In a conventional switching detection circuit, the AC power connection's neutral/live/ground are not used for the switching detection and an additional connection is required as the ground connection. However, most household electricity configuration does not have an extra ground connection that can be used by a conventional switching detection circuit. Consequently, compared to a conventional switching detection circuit, the electrical device 600 can be used by average household to detect 3-way switching without requiring an extra ground connection. No matter which stationary contact the 3-way switch system's movable contact is connected with, the reference voltage for the switching detection is the same, which is the voltage of the live wire 218. However, during the switching moment of the 3-way switch system 615, the movable contact of a 3-way switch 614-1 or 614-2 is not connected with any stationary contact, which can be used to trigger the corresponding switching of the switch module 222.

Figure 7:
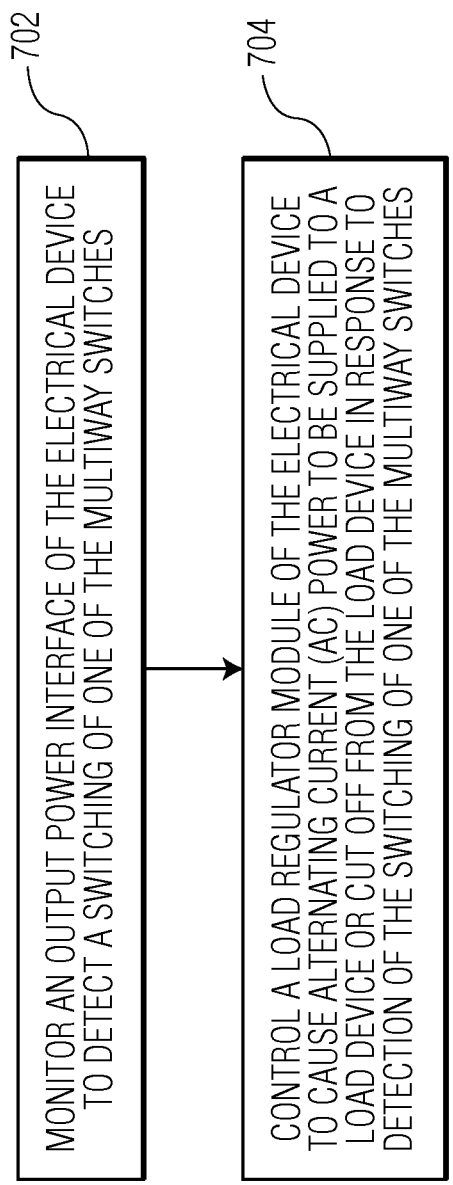
FIG. 7 is a process flow diagram that illustrates a method for operating an electrical device that is installed within an electrical gang/patress box for use with multiway switches in accordance with an embodiment of the invention.

FIG. 7 is a process flow diagram that illustrates a method for operating an electrical device that is installed within an electrical gang/patress box for use with multiway switches in accordance with an embodiment of the invention. The electrical device may be the same as or similar to the electrical device 100 depicted in FIG. 1, the electrical device 200 depicted in FIG. 2, and/or the electrical device 600 depicted in FIG. 6. The electrical gang/patress box may be the same as or similar to the electrical gang/patress box 102, 122, 202, 252, or 262. The multiway switches may be the same as or similar to the multiway switches 116-1, 116-2 depicted in FIG. 1, the 3-way switches 214-1, 214-2, and the DPST 217 depicted in FIG. 2, and/or the 3-way switches 614-1, 614-2 depicted in FIG. 6. At block 702, an output power interface of the electrical device is monitored to detect a switching of one of the multiway switches. At block 704, a load regulator module of the electrical device is controlled to cause AC power to be supplied to a load device or cut off from the load device in response to detection of the switching of one of the multiway switches.

Figure 8:
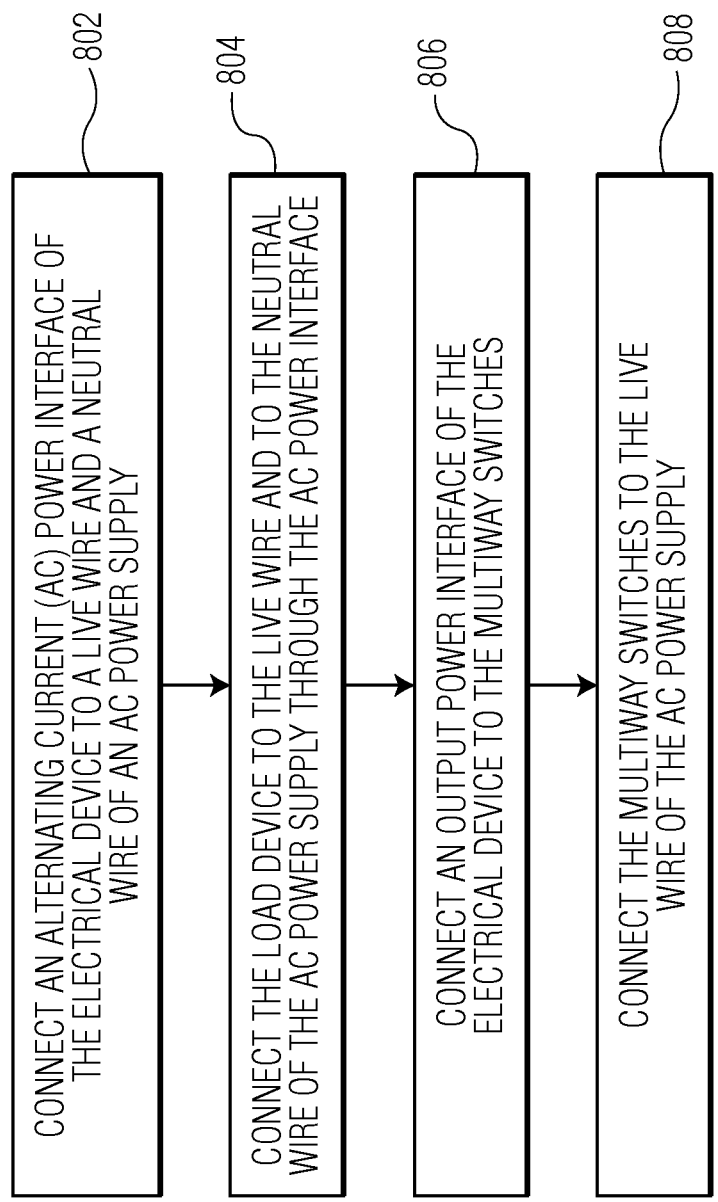
FIG. 8 is a process flow diagram that illustrates a method for connecting an electrical device with a load device and multiway switches for controlling the load device in accordance with an embodiment of the invention.

FIG. 8 is a process flow diagram that illustrates a method for connecting an electrical device with a load device and multiway switches for controlling the load device in accordance with an embodiment of the invention. The electrical device may be the same as or similar to the electrical device 100 depicted in FIG. 1, the electrical device 200 depicted in FIG. 2, and/or the electrical device 600 depicted in FIG. 6. The load device may be the same as or similar to the load device 110 depicted in FIG. 1 and/or the load device 210 depicted in FIG. 2. The multiway switches may be the same as or similar to the multiway switches 116-1, 116-2 depicted in FIG. 1, the 3-way switches 214-1, 214-2, and the DPST 217 depicted in FIG. 2, and/or the 3-way switches 614-1, 614-2 depicted in FIG. 6. At block 802, an AC power interface of the electrical device is connected to a live wire and a neutral wire of an AC power supply. At block 804, the load device is connected to the live wire and to the neutral wire of the AC power supply through the AC power interface. At block 806, an output power interface of the electrical device is connected to the multiway switches. At block 808, the multiway switches are connected to the live wire of the AC power supply.

Figure 9A:
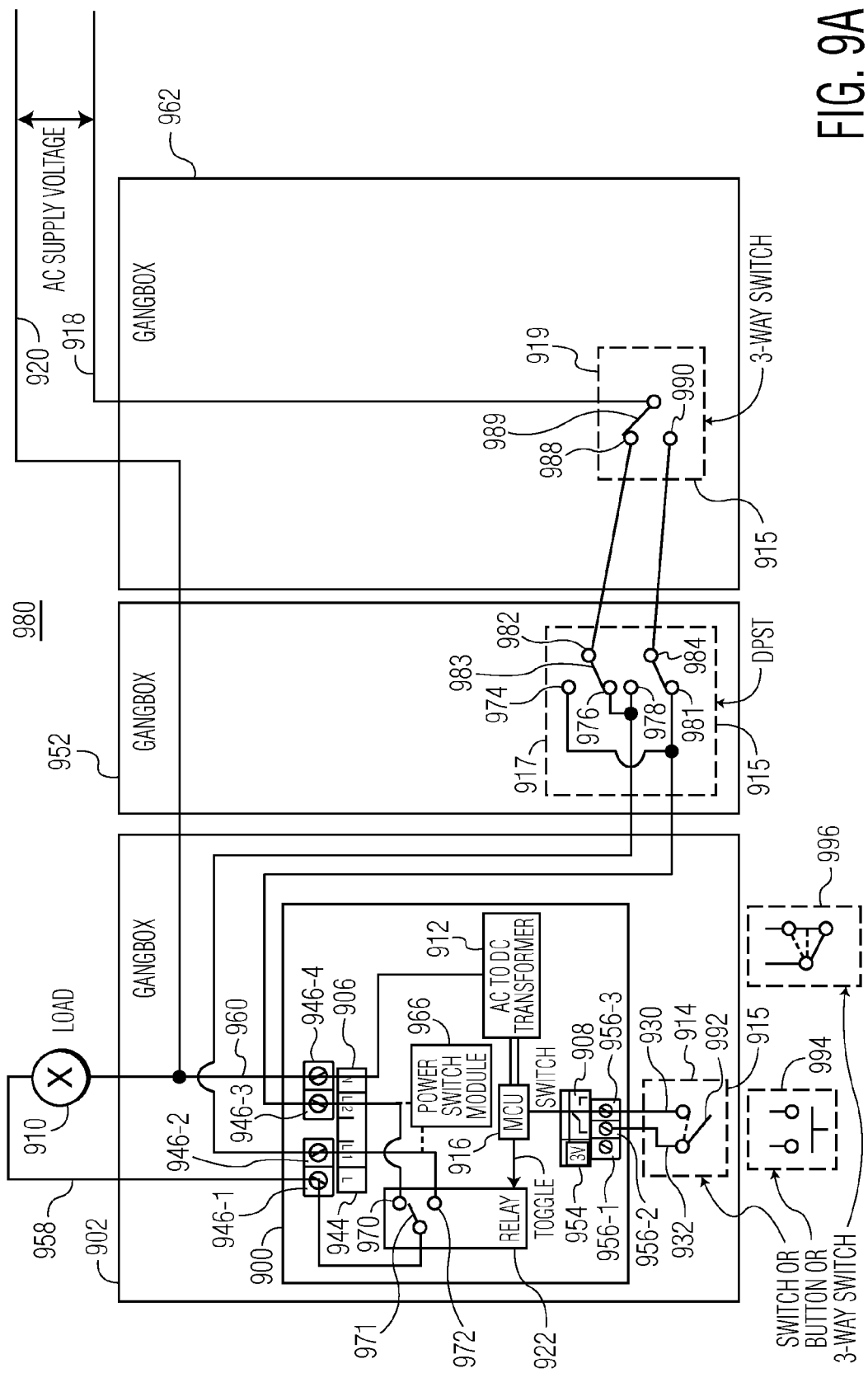
FIG. 9A is a schematic block diagram of another electrical device in accordance with an embodiment of the invention.

FIG. 9A depicts an embodiment of an electrical device 900 that is used with a multiway switch system 915 that includes a switch unit 914, and a DPST 917, and a 3-way switch 919. Although the switch unit, the DPST, and the 3-way switch are used with the electrical device 900 in the embodiment depicted in FIG. 9A, in other embodiments, a different combination of switches can be used with the electrical device 900. In the embodiment depicted in FIG. 9A, the electrical device 900 of an electrical system 980 includes an AC power interface 906, an output power interface 908, an AC to DC transformer 912, a microcontroller unit (MCU) module 916, a relay module 922, and a power switch module 966. The AC power interface 906, the output power interface 908, the AC to DC transformer 912, the MCU module 916, and the relay module 922 may be similar to or the same as the AC power interface 206, the output power interface 208, the AC to DC transformer 212, the MCU module 216, and the switch module 222, respectively. The electrical device 900 and the switch unit 914 are installed in an electrical gang/patress box 902. The switch unit 914 may be implemented as a single pole, single throw switch 992, a button switch 994, or a 3-way switch 996. The DPST 917, with switch terminals/contacts 974, 976, 978, 981, 982, 984 and a switch arm 983, is installed in an electrical gang/patress box 952 and the 3-way switch 919, with switch terminals/contacts 988, 990 and a switch arm 989, is installed in an electrical gang/patress box 962. For example, the electrical gang/patress boxes 902, 952, 962 can be installed at different sections of a stairway, a long hallway, or a large room. The electrical gang/patress boxes 902, 952, 962 are similar as or the same as the electrical gang/patress box 102.

Although the electrical device 900 is shown as including certain components, in some embodiments, the electrical device 900 includes less or more components to implement less or more functionalities. Circuit elements that can be included in the electrical device 900 are not limited to the components depicted in FIG. 9A. For example, the electrical device 900 may include at least one additional component, such as an energy meter module, a Radio Frequency (RF) transceiver module, an antenna, and/or an internal button in some cases. In an embodiment, the electrical device 900 does not have wireless communications capability. In an embodiment, the electrical device 900 includes an energy meter module that is configured to measure energy consumption of a load device of the electrical device 900. The energy meter module can measure the energy consumption of the load device in wattage, voltage, current, and kilowatt hour (kWh). In an embodiment, the energy meter module reports or transmits the energy consumption parameters to the MCU module 916. In some embodiments, the electrical device has a physical button configured to receive a user input for controlling the electrical device. In some embodiments, the physical button is used to control the MCU module to dim, turn on, or turn off a load device of the electrical device 900. In some embodiments, the physical button is located on a major surface of the electrical device 900 and can be activated by a user. For example, an electrician or a home owner can apply physical force to the physical button to control the electrical device 900. The electrical device 900 may include a status indication light-emitting diode (LED) and pressing the physical button can cause the LED to blink accordingly, indicating an operating status of the electrical device 900.

In the embodiment depicted in FIG. 9A, the electrical device 900 receives an AC input signal through the AC power interface 906 and outputs an AC output signal for powering a load device 910, which is similar to or the same as the load device 110. Compared to a conventional electrical system in which a load device is directly connected between switches, the electrical device 900 serves as an intermediary that insulates the load device 910 from the switches 914, 917, 919. Consequently, if a switch 914, 917, or 919 shorts, the electrical device 900 can shield the load device from the short and prevent damage to the load device and an electricity meter of the AC power supply. The electrical device 900 also outputs a voltage signal to the switch unit 914 through the output power interface 908. In some embodiments, the electrical device 900 also generates a low-voltage DC signal that is inputted into a low-voltage DC electronic device, such as a touch panel.

The power interface 906 or 908 may include one or more I/O pins, ports, or sockets. In the embodiment depicted in FIG. 9A, each power interface 906 or 908 is a screw-type power interface that includes at least one screw and at least one wire socket controllable by the at least one screw. However, power interfaces of the electrical device 900 are not limited to the examples described herein. In other embodiments, other types of power interfaces, such as non-screw types of power interfaces, may be used. In addition, although the power interfaces are depicted in FIG. 9A as including certain numbers of sockets, in other embodiments, the number of sockets included in the power interfaces may be different from the number of sockets as depicted in FIG. 9A.

The AC power interface 906 includes a label 944 and four sockets 946-1, 946-2, 946-3, 946-4 that are located underneath corresponding screws and are marked by the label 944. The sockets 946-1, 946-2, 946-3, 946-4 are used to connect power cables/wires. Adjusting the screws can cause the power cables to be connected or disconnected from the electrical device 900. In the embodiment depicted in FIG. 9A, AC power is carried by a neutral wire 920 and a live wire 918. In an embodiment, the neutral wire 920 is connected to the socket 946-4 of the AC power interface and the load device 910 while the live wire 918 is connected to the 3-way switch 919. The load device 910 is connected to the sockets 946-1, 946-4. The load device 910 is connected to the socket 946-1 via a live wire 958. The sockets 946-1, 946-2, which are labeled as "L," and "L1," are connected to each other. The sockets 946-3, 946-4, which are labeled as "L2," and "N," are connected to each other. The load device 910 is connected to the socket 946-4 via a neutral wire 960. The electrical device 900, the live wire 958, the load device 910, and the neutral wire 960 can form a closed circuit. Consequently, the electrical device 900 can control the power that is supplied to the load device 910.

The output power interface 908 includes a label 954 and three sockets 956-1, 956-2, 956-3 that are located underneath corresponding screws and are marked by the label 954. The sockets 956-1, 956-2, 956-3 are used to connect power cables/wires. Adjusting the screws can cause the power cables to be connected or disconnected from the electrical device 900. An AC power signal or a DC power signal can be output to the switch unit 914 via the socket 956-2 and/or the socket 956-3, which is labeled by a switch symbol. In an embodiment, the output signal may be an AC power signal that is delivered to the switch unit 914 via live wires 930, 932. The electrical device 900, the live wires 930, 932, and the switch unit 914 can form a closed circuit. Consequently, the switching of the switch unit 914 can affect the operation of the electrical device 900 and trigger a response from the electrical device 900.

The AC to DC transformer 912 of the electrical device 900 is configured to transform an AC input signal, which is carried by the neutral wire 920 and the live wire 918, into a low DC voltage for other components of the electrical device 900. In the embodiment depicted in FIG. 9A, the AC to DC transformer 912 uses a three-wire design that requires a neutral connection. In some embodiments, the AC to DC transformer 912 uses a 2-wire connection with no neutral link. The AC to DC transformer can work with standard voltages in various countries and regions, including North America, Europe, Middle East, Central America and the Caribbean, South America, Africa, Australia and Oceania. In an embodiment, the AC to DC transformer can transform an input AC voltage of 110V/60 Hz or 230V or 240V/50 Hz or 60 Hz into a suitable low DC voltage. For example, the AC to DC transformer can transform an AC power input voltage of around 120V to an internal DC voltage of 5V or any suitable value.

The relay module 922 of the electrical device 900 is configured to control the load device 910, for example, to turn on/off the load device 910, or to dim the load device 910 (e.g., reduce the supplied power to the load device 910). The dimming of a load is not limited to reducing or increasing the light intensity of an electric light. In an embodiment, the relay module speeds up or speeds down an electric fan or other electrical apparatus. The relay module can turn on/off or dim the load device under the control of the MCU module 916. In some embodiments, instead of the relay module 922, the electrical device 900 includes a switch module that is implemented as a Triode for Alternating Current (TRIAC) circuit or any other suitable switching component that is known in the art.

The power switch module 966 of the electrical device 900 is configured to ensure electrical insulation between different sections of the AC power interface 906. In addition, the power switch module is used to prevent electrical short in the AC power interface 906. In some embodiments, the power switch module insulates the socket 946-2 from the socket 946-3 and prevents electrical short of sockets 946-2, 946-3. The power switch module allows the electrical device 900 to receive AC power through either the socket 946-2 or the socket 946-3 of the AC power interface 906. In the embodiment depicted in FIG. 9A, the power switch module is electrically connected to the relay module 922 and/or the AC to DC transformer 912. In some embodiments, the power switch module is integrated into the AC to DC transformer.

Figure 9B:
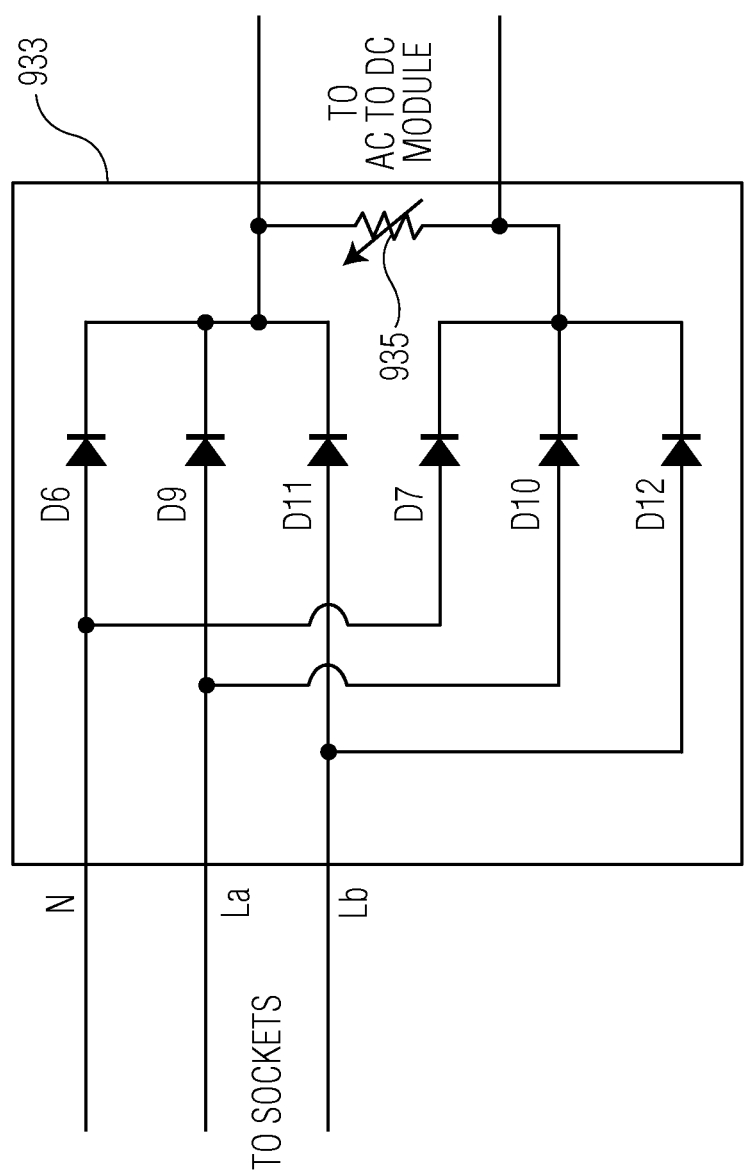
FIG. 9B depicts an embodiment of the power switch module of the electrical device depicted in FIG. 9A.

In some embodiments, the power switch module 966 is implemented with diodes. FIG. 9B depicts an embodiment of the power switch module 966. In the embodiment depicted in FIG. 9B, a power switch module 933 includes diodes "D6," "D7," "D9," "D10," "D11," "D12," and a variable resistor 935 with a variable resistance. In the embodiment depicted in FIG. 9B, the power switch module 933 acts as a full-wave rectifier, which converts the whole input waveform to one of constant polarity (positive or negative) at its output. A negative half-wave (half-cycle) input, "N," (e.g., a negative half-wave current signal) is inputted into the diode, "D6." Based on the single electrical conductive direction of the diodes of the power switch module 933, the power switch module 933 provides electrical insulation between parallel input lines, "La," "Lb," which are connected to the sockets 946-2, 946-3 (shown in FIG. 9A) and supplies power to the AC to DC transformer 912 (shown in FIG. 9A). The power switch module 933 depicted in FIG. 9B is one possible embodiment of the power switch module 966 depicted in FIG. 9A. However, the power switch module 966 depicted in FIG. 9A is not limited to the embodiment depicted in FIG. 9B.

Turning back to FIG. 9A, the MCU module 916 of the electrical device 900 is configured to control other components of the electrical device 900 (e.g., the relay module 922, the power switch module 966, the AC power interface 906, and/or the output power interface 908). The MCU module can control the relay module, the power switch module, the AC power interface 906, and/or the output power interface 908 in response to the DC voltage signal from the AC to DC transformer 912. The MCU module, which can be implemented in the form of a microcontroller, may be powered by the AC to DC transformer 912. In an embodiment, the MCU module outputs an AC power signal to the switch unit 914 through the sockets 956-2, 956-3 and the live wires 930, 932. The voltage of the AC output power signal may be the same or similar to the voltage of the AC input power signal that is inputted into the electrical device 900 through the live wire 918. In some embodiments, the voltage of the AC power input signal and the voltage of the output signal from the socket 956-2 or 956-3 are around 120V (e.g., within ±10% of 120V) or around 230V (e.g., within ±10% of 230V). Although an example voltage of the AC output signal is provided, the voltage of the AC output signal can be at any suitable value and is not limited to the example provided. In some embodiments, the toggle of the switch unit 914 (e.g., from open to close or from close to open) causes a General-purpose input/output (GPIO) signal that flows into the MCU module 916 to change (e.g., from high to low or from low to high). Based on the change of the GIPO signal, the MCU module controls the relay module 922 to connect the socket 946-1 to a switch contact 970 or a switch contact 972 of the relay module 922. In some embodiments, the MCU module 916 outputs a low-voltage DC output signal via the socket 956-1 that is labeled as, "DC," to power a low-voltage DC device. A low-voltage DC device, such as a touch panel, can be powered directly by the low-voltage output without needing an AC transformer or battery. The voltage of the low-voltage DC output signal is lower than the voltage of the AC input power signal that is carried by the neutral wire 920 and the live wire 918. In some embodiments, the voltage of the AC power input signal is around 120V (e.g., within ±10% of 120V) or around 230V (e.g., within ±10% of 230V), and the voltage of the low-voltage DC output signal is around 3.3V (e.g., within ±10% of 3.3V). Although an example voltage (3.3V) of the low-voltage DC output signal is provided, the voltage of the low-voltage DC output signal can be at any suitable value and is not limited to the example provided. In some embodiments, the MCU module 916 includes a non-volatile memory unit. In the event of power failure, the non-volatile memory retains all programmed information relating to the operating status of the electrical device 900. Alternatively, the non-volatile memory may be separate from the MCU module.

The electrical device 900 allows the load device 910 to be connected to the AC power carried by wires 918, 920 or disconnected from the AC power by toggle the switch unit 914, the DPST 917, or the 3-way switch 919. In the circuit configuration shown in FIG. 9A, the load device is disconnected from the AC power initially. Specifically, the current flows between switch terminals and electrical socket in the direction of 988→982→976→946-2→972. Because the switch terminal 972 of the relay module 922 is not electrically connected to the switch arm 971 of the relay module 922, the load device 910, the electrical device 900, and the multiway switch system 915 do not form a closed circuit. Consequently, the load device is disconnected from the AC power initially.

In one example of the operation of the electrical device 900, the a-way switch 919 is toggled such that the switch arm 989 of the 3-way switch 919 is in contact with the switch terminal 990 of the 3-way switch 919. After the 3-way switch 919 is toggled, the current flows between switch terminals and electrical socket in the direction of 990→984→981→946-3→970. Because the switch terminal 970 of the relay module 922 is connected to the switch arm 971 of the relay module 922, the load device 910, the electrical device 900, and the multiway switch system form a closed circuit. Consequently, the load device is connected to the AC power.

In another example of the operation of the electrical device 900, the DPST 917 is toggled such that the switch arm 983 of the DPST 917 is in contact with the switch terminal 976 of the DPST 917. The current flows between switch terminals and electrical socket in the direction of 988→982→976→946-2→970. Because the switch terminal 970 of the relay module 922 is connected to the switch arm 971 of the relay module 922, the load device 910, the electrical device 900, and the multiway switch system form a closed circuit. Consequently, the load device is connected to the AC power.

In another example of the operation of the electrical device 900, the switch unit 914, which may be implemented as a single pole, single throw switch 992, a button switch 994, or a 3-way switch 996, is toggled such that the electrical device 900 and the switch unit 914 form a closed circuit. For example, the single pole, single throw switch 992 may be toggled such that the switch 992 is closed (i.e., conductive). The toggling of the switch unit 914 causes changes in GPIO signals that flows into the MCU module 916 and the MCU module controls the relay module 922 to connect the socket 946-1 to the switch contact 972 of the relay module 922. Consequently, the load device 910, the electrical device 900, and the multiway switch system 915 form a closed circuit and the load device is connected to the AC power.

In the case the switch unit 914 is implemented as the 3-way switch 996, the switching of the 3-way switch 996 causes a high voltage at the output power interface 908. After the moment of switching, the voltage at the output power interface 908 is back to a low normal level. In some embodiments, the MCU module 916 senses the voltage changes at the output power interface 908 and switches the relay/switch module 922 accordingly. The MCU module 916 may detect the sudden rise (e.g., the rising edge) and the sudden dip (e.g., the falling edge) of the voltage waveform and causes the relay module 922 to switch and start/stop the supply of the AC power to the load device 910. The MCU module 916 may use a software routine to implement the monitoring of the waveform and the notification of the relay module 922. The software routine may be stored in a memory module that is accessible by the MCU module.

In the case the switch unit 914 is implemented as the button switch 994, the switching of the button switch causes a low voltage at the output power interface 908. After the moment of switching, the voltage at the output power interface 908 is back to a low level. In some embodiments, the MCU module 916 detects the sudden drop (e.g., the falling edge) and the sudden rise (e.g., the rising edge) of the voltage waveform and causes the relay module 922 to switch and start/stop the supply of the AC power to the load device 910. The MCU module 916 may use a software routine to implement the monitoring of the waveform and the notification of the relay module 922. The software routine may be stored in a memory module that is accessible by the MCU module.

Compared to the electrical device 200 depicted in FIG. 2 that connects a load device to AC power or disconnect the load device from AC power based on output voltage changes, the electrical device 900 depicted in FIG. 9A connects the load device 910 to AC power or disconnect the load device from AC power based on mechanical movements of switch arms of the switch unit 914, the DPST 917, and the 3-way switch 919. Because the possibility of mechanical malfunctions of switches is much lower than the possibility of erroneous detection of output voltage changes, the reliability of the electrical device 900 depicted in FIG. 9A is higher than the reliability of the electrical device 200 depicted in FIG. 2. In addition, compared to the electrical device 200 depicted in FIG. 2 that requires direct electrical connection between switches, the electrical device 900 depicted in FIG. 9A does not require a direct electrical connection between the switch unit 914 attached to the output power interface 908 and the DPST 917 or the 3-way switch 919. Consequently, the electrical device 900 depicted in FIG. 9A can be used with multiway switches without changing the electrical configuration of the multiway switches and the cost of installing the electrical device 1000 can be reduced.

Figure 10:
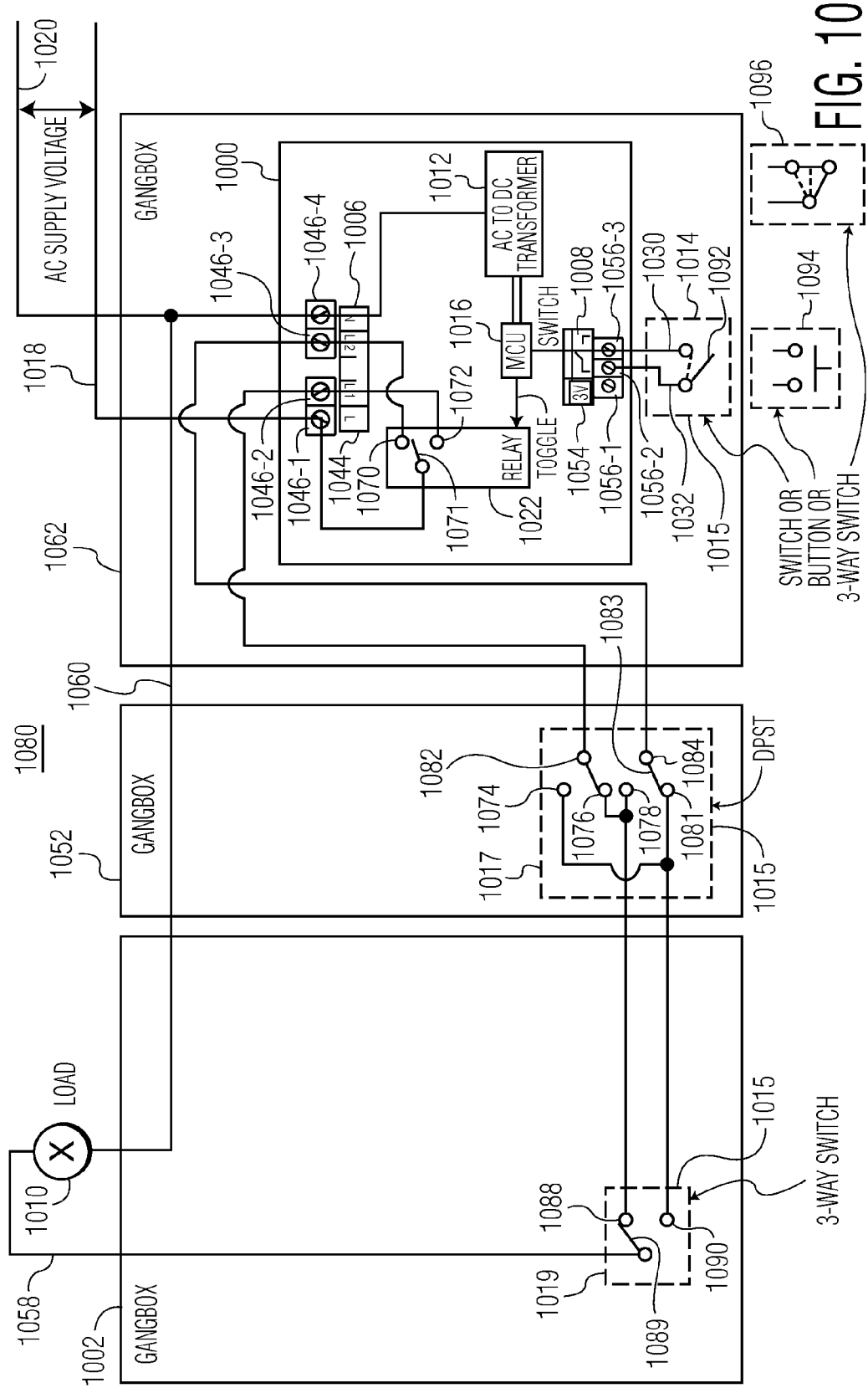
FIG. 10 is a schematic block diagram of another electrical device in accordance with an embodiment of the invention.

FIG. 10 depicts an embodiment of an electrical device 1000 that is used with a multiway switch system 1015 that includes a switch unit 1014, and a DPST 1017, and a 3-way switch 1019. Although the switch unit, the DPST, and the 3-way switch are used with the electrical device 1000 in the embodiment depicted in FIG. 10, in other embodiments, a different combination of switches can be used with the electrical device 1000. In the embodiment depicted in FIG. 10, the electrical device 1000 of an electrical system 1080 includes an AC power interface 1006, an output power interface 1008, an AC to DC transformer 1012, a microcontroller unit (MCU) module 1016, and a relay module 1022. The AC power interface 1006, the output power interface 1008, the AC to DC transformer 1012, the MCU module 1016, the relay module 1022 may be similar to or the same as the AC power interface 206 or 906, the output power interface 208 or 908, the AC to DC transformer 212 or 912, the MCU module 216 or 916, and the switch/relay module 222 or 922, respectively. The electrical device 1000 and the switch unit 1014 are installed in an electrical gang/patress box 1062. The switch unit 1014 may be implemented as a single pole, single throw switch 1092, a button switch 1094, or a 3-way switch 1096. The DPST 1017 is installed in an electrical gang/patress box 1052 and the 3-way switch 1019 is installed in an electrical gang/patress box 1002. For example, the electrical gang/patress boxes 1002, 1052, 1062 can be installed at different sections of a stairway, a long hallway, or a large room. The electrical gang/patress boxes 1002, 1052, 1062 are similar as or the same as the electrical gang/patress box 102.

Although the electrical device 1000 is shown as including certain components, in some embodiments, the electrical device 1000 includes less or more components to implement less or more functionalities. Circuit elements that can be included in the electrical device 1000 are not limited to the components depicted in FIG. 10. For example, the electrical device 1000 may include at least one additional component, such as an energy meter module, a Radio Frequency (RF) transceiver module, an antenna, and/or an internal button in some cases. In an embodiment, the electrical device 1000 does not have wireless communications capability. In an embodiment, the electrical device 1000 includes an energy meter module that is configured to measure energy consumption of a load device of the electrical device 1000. The energy meter module can measure the energy consumption of the load device in wattage, voltage, current, and kilowatt hour (kWh). In an embodiment, the energy meter module reports or transmits the energy consumption parameters to the MCU module 1016. In some embodiments, the electrical device has a physical button configured to receive a user input for controlling the electrical device. In some embodiments, the physical button is used to control the MCU module to dim, turn on, or turn off a load device of the electrical device 1000. In some embodiments, the physical button is located on a major surface of the electrical device 1000 and can be activated by a user. For example, an electrician or a home owner can apply physical force to the physical button to control the electrical device 1000. The electrical device 1000 may include a status indication light-emitting diode (LED) and pressing the physical button can cause the LED to blink accordingly, indicating an operating status of the electrical device 1000.

In the embodiment depicted in FIG. 10, the electrical device 1000 receives an AC input signal through the AC power interface 1006 and outputs an AC output signal for powering the load device 1010, which is similar to or the same as the load device 110. Compared to a conventional electrical system in which a load device is directly connected between switches, the electrical device 1000 serves as an intermediary that insulates the load device 1010 from the switches 1014, 1017, 1019. Consequently, if a switch 1014, 1017, or 1019 shorts, the electrical device 1000 can shield the load device from the short and prevent damage to the load device and an electricity meter of the AC power supply. The electrical device 1000 also outputs a voltage signal to the switch unit 1014 through the output power interface 1008. In some embodiments, the electrical device 1000 also generates a low-voltage DC signal that is inputted into a low-voltage DC electronic device, such as a touch panel.

The power interface 1006 or 1008 may include one or more I/O pins, ports, or sockets. In the embodiment depicted in FIG. 10, each power interface 1006 or 1008 is a screw-type power interface that includes at least one screw and at least one wire socket controllable by the at least one screw. However, power interfaces of the electrical device 1000 are not limited to the examples described herein. In other embodiments, other types of power interfaces, such as non-screw types of power interfaces, may be used. In addition, although the power interfaces are depicted in FIG. 10 as including certain numbers of sockets, in other embodiments, the number of sockets included in the power interfaces may be different from the number of sockets as depicted in FIG. 10.

The AC power interface 1006 includes a label 1044 and four sockets 1046-1, 1046-2, 1046-3, 1046-4 that are located underneath corresponding screws and are marked by the label 1044. The sockets 1046-1, 1046-2, 1046-3, 1046-4 are used to connect power cables/wires. Adjusting the screws can cause the power cables to be connected or disconnected from the electrical device 1000. In the embodiment depicted in FIG. 10, AC power is carried by a neutral wire 1020 and a live wire 1018. In an embodiment, the neutral wire 1020 is connected to the socket 1046-4 of the AC power interface and the load device 1010 while the live wire 1018 is connected to the socket 1046-1 of the AC power interface. The load device 1010 is connected to the socket 1046-4 via a neutral wire 1060 and to the 3-way switch 1019 via a live wire 1058. Compared to the electrical device 900 in which AC power is supplied to two sockets in different sections of the AC power interface 906, AC power is supplied to a single socket 1046-1 of the AC power interface 1006 of the electrical device 1000. Consequently, the power switch module 966 of the electrical device 900 depicted in FIG. 9A for ensuring electrical insulation between different sections of the AC power interface 906 is not required in the electrical device 1000. The sockets 1046-1, 1046-2, which are labeled as "L," and "L1," are connected to each other. The sockets 1046-3, 1046-4, which are labeled as "L2," and "N," are connected to each other. The electrical device 1000, the live wire 1058, the load device 1010, and the neutral wire 1060 can form a closed circuit. Consequently, the electrical device 1000 can control the power that is supplied to the load device 1010.

The output power interface 1008 includes a label 1054 and three sockets 1056-1, 1056-2, 1056-3 that are located underneath corresponding screws and are marked by the label 1054. The sockets 1056-1, 1056-2, 1056-3 are used to connect power cables/wires. Adjusting the screws can cause the power cables to be connected or disconnected from the electrical device 1000. An AC power signal or a DC power signal can be output to the switch unit 1014 via the socket 1056-2 and/or the socket 1056-3, which is labeled by a switch symbol. In an embodiment, the output signal may be an AC power signal that is delivered to the switch unit 1014 via live wires 1030, 1032. The electrical device 1000, the live wires 1030, 1032, and the switch unit 1014 can form a closed circuit. Consequently, the switching of the switch unit 1014 can affect the operation of the electrical device 1000 and trigger a response from the electrical device 1000.

The AC to DC transformer 1012 of the electrical device 1000 is configured to transform an AC input signal, which is carried by the neutral wire 1020 and the live wire 1018, into a low DC voltage for other components of the electrical device 1000. In the embodiment depicted in FIG. 10, the AC to DC transformer 1012 uses a three-wire design that requires a neutral connection. In some embodiments, the AC to DC transformer 1012 uses a 2-wire connection with no neutral link. The AC to DC transformer can work with standard voltages in various countries and regions, including North America, Europe, Middle East, Central America and the Caribbean, South America, Africa, Australia and Oceania. In an embodiment, the AC to DC transformer can transform an input AC voltage of 110V/60 Hz or 230V or 240V/50 Hz or 60 Hz into a suitable low DC voltage. For example, the AC to DC transformer can transform an AC power input voltage of around 120V to an internal DC voltage of 5V or any suitable value.

The relay module 1022 of the electrical device 1000 is configured to control the load device 1010, for example, to turn on/off the load device 1010, or to dim the load device 1010 (e.g., reduce the supplied power to the load device 1010). The dimming of a load is not limited to reducing or increasing the light intensity of an electric light. In an embodiment, the relay module speeds up or speeds down an electric fan or other electrical apparatus. The relay module can turn on/off or dim the load device under the control of the MCU module 1016. In some embodiments, instead of the relay module 1022, the electrical device 1000 includes a switch module that is implemented as a Triode for Alternating Current (TRIAC) circuit or any other suitable switching component that is known in the art.

The MCU module 1016 of the electrical device 1000 is configured to control other components of the electrical device 1000 (e.g., the relay module 1022, the AC power interface 1006, and/or the output power interface 1008). The MCU module can control the relay module, the AC power interface 1006, and/or the output power interface 1008 in response to the DC voltage signal from the AC to DC transformer 1012. The MCU module, which can be implemented in the form of a microcontroller, may be powered by the AC to DC transformer 1012. In an embodiment, the MCU module outputs an AC power signal to the switch unit 1014 through the sockets 1056-2, 1056-3 and the live wires 1030, 1032. The voltage of the AC output power signal may be the same or similar to the voltage of the AC input power signal that is inputted into the electrical device 1000 through the live wire 1018. In some embodiments, the voltage of the AC power input signal and the voltage of the output signal from the socket 1056-2 or 1056-3 are around 120V (e.g., within ±10% of 120V) or around 230V (e.g., within ±10% of 230V). Although an example voltage of the AC output signal is provided, the voltage of the AC output signal can be at any suitable value and is not limited to the example provided. In some embodiments, the toggle of the switch unit 1014 (e.g., from open to close or from close to open) causes a General-purpose input/output (GPIO) signal that flows into the MCU module 1016 to change (e.g., from high to low or from low to high). Based on the change of the GIPO signal, the MCU module controls the relay module 1022 to connect the socket 1046-1 to a switch contact 1070 or a switch contact 1072 of the relay module 1022. In some embodiments, the MCU module 1016 outputs a low-voltage DC output signal via the socket 1056-1 that is labeled as, "DC," to power a low-voltage DC device. A low-voltage DC device, such as a touch panel, can be powered directly by the low-voltage output without needing an AC transformer or battery. The voltage of the low-voltage DC output signal is lower than the voltage of the AC input power signal that is carried by the neutral wire 1020 and the live wire 1018. In some embodiments, the voltage of the AC power input signal is around 120V (e.g., within ±10% of 120V) or around 230V (e.g., within ±10% of 230V), and the voltage of the low-voltage DC output signal is around 3.3V (e.g., within ±10% of 3.3V). Although an example voltage (3.3V) of the low-voltage DC output signal is provided, the voltage of the low-voltage DC output signal can be at any suitable value and is not limited to the example provided. In some embodiments, the MCU module 1016 includes a non-volatile memory unit. In the event of power failure, the non-volatile memory retains all programmed information relating to the operating status of the electrical device 1000. Alternatively, the non-volatile memory may be separate from the MCU module.

The electrical device 1000 allows the load device 1010 to be connected to the AC power carried by wires 1018, 1020 or disconnected from the AC power by toggle the switch unit 1014, the DPST 1017, or the 3-way switch 1019. In the circuit configuration shown in FIG. 10, the load device is disconnected from the AC power initially. Specifically, the current flows between switch terminals and electrical socket in the direction of 1070→1046-3→1084→1081→1090. Because the switch terminal 1090 of the 3-way switch 1019 is not electrically connected to the switch arm 1089 of the 3-way switch 1019, the load device 1010, the electrical device 1000, and the multiway switch system 1015 do not form a closed circuit. Consequently, the load device is disconnected from the AC power initially.

In one example of the operation of the electrical device 1000, the a-way switch 1019 is toggled such that the switch arm 1089 of the 3-way switch 1019 is in contact with the switch terminal 1090 of the 3-way switch 1019. After the 3-way switch 1019 is toggled, the current flows between switch terminals and electrical socket in the direction of 1070→1046-3→1084→1081→1090. Because the switch terminal 1090 of the 3-way switch 1019 is electrically connected to the switch arm 1089 of the 3-way switch 1019, the load device 1010, the electrical device 1000, and the multiway switch system 1015 form a closed circuit. Consequently, the load device is connected to the AC power.

In another example of the operation of the electrical device 1000, the DPST 1017 is toggled such that the switch arm 1083 of the DPST 1017 is in contact with the switch terminal 1078 of the DPST 1017. The current flows between switch terminals and electrical socket in the direction of 1070→1046-3→1084→1078→1088. Because the switch terminal 1088 of the 3-way switch 1019 is electrically connected to the switch arm 1089 of the 3-way switch 1019, the load device 1010, the load device 1010, the electrical device 1000, and the multiway switch system 1015 form a closed circuit. Consequently, the load device is connected to the AC power.

In another example of the operation of the electrical device 1000, the switch unit 1014, which may be implemented as a single pole, single throw switch 1092, a button switch 1094, or a 3-way switch 1096, is toggled such that the electrical device 1000 and the switch unit 1014 form a closed circuit. For example, the single pole, single throw switch 1092 may be toggled such that the switch 1092 is closed (i.e., conductive). The toggling of the switch unit 1014 causes changes in GPIO signals that flows into the MCU module 1016 and the MCU module controls the relay module 1022 to connect the socket 1046-1 to the switch contact 1072 of the relay module 1022 via a switch arm 1071. Consequently, the load device 1010, the electrical device 1000, and the multiway switch system 1015 form a closed circuit and the load device is connected to the AC power.

In the case the switch unit 1014 is implemented as the 3-way switch 1096, the switching of the 3-way switch 1096 causes a high voltage at the output power interface 1008. After the moment of switching, the voltage at the output power interface 1008 is back to a low normal level. In some embodiments, the MCU module 1016 senses the voltage changes at the output power interface 1008 and switches the relay/switch module 1022 accordingly. The MCU module 1016 may detect the sudden rise (e.g., the rising edge) and the sudden dip (e.g., the falling edge) of the voltage waveform and causes the relay module 1022 to switch and start/stop the supply of the AC power to the load device 1010. The MCU module 1016 may use a software routine to implement the monitoring of the waveform and the notification of the relay module 1022. The software routine may be stored in a memory module that is accessible by the MCU module.

In the case the switch unit 1014 is implemented as the button switch 1094, the switching of the button switch causes a low voltage at the output power interface 1008. After the moment of switching, the voltage at the output power interface 1008 is back to a low level. In some embodiments, the MCU module 1016 detects the sudden drop (e.g., the falling edge) and the sudden rise (e.g., the rising edge) of the voltage waveform and causes the relay module 1022 to switch and start/stop the supply of the AC power to the load device 1010. The MCU module 1016 may use a software routine to implement the monitoring of the waveform and the notification of the relay module 1022. The software routine may be stored in a memory module that is accessible by the MCU module.

Compared to the electrical device 200 depicted in FIG. 2 that connects a load device to AC power or disconnect the load device from AC power based on output voltage changes, the electrical device 1000 depicted in FIG. 10 connects the load device 1010 to AC power or disconnect the load device from AC power based on mechanical movements of switch arms of the switch unit 1014, the DPST 1017, and the 3-way switch 1019. Because the possibility of mechanical malfunctions of switches is much lower than the possibility of erroneous detection of output voltage changes, the reliability of the electrical device 1000 depicted in FIG. 10 is higher than the reliability of the electrical device 200 depicted in FIG. 2. In addition, compared to the electrical device 200 depicted in FIG. 2 that requires direct electrical connection between switches, the electrical device 1000 depicted in FIG. 10 does not require a direct electrical connection between the switch unit 1014 attached to the output power interface 1008 and the DPST 1017 or the 3-way switch 1019. Consequently, the electrical device 1000 depicted in FIG. 10 can be used with multiway switches without changing the electrical configuration of the multiway switches and the cost of installing the electrical device 1000 can be reduced. Compared to the electrical device 900 in which AC power is supplied to two sockets in different sections of the AC power interface 906, AC power is supplied to a single socket 1046-1 of the AC power interface 1006 of the electrical device 1000. Consequently, the power switch module 966 of the electrical device 900 is not required in the electrical device 1000 and the component cost of the electrical device 1000 can be reduced.

Figure 11:
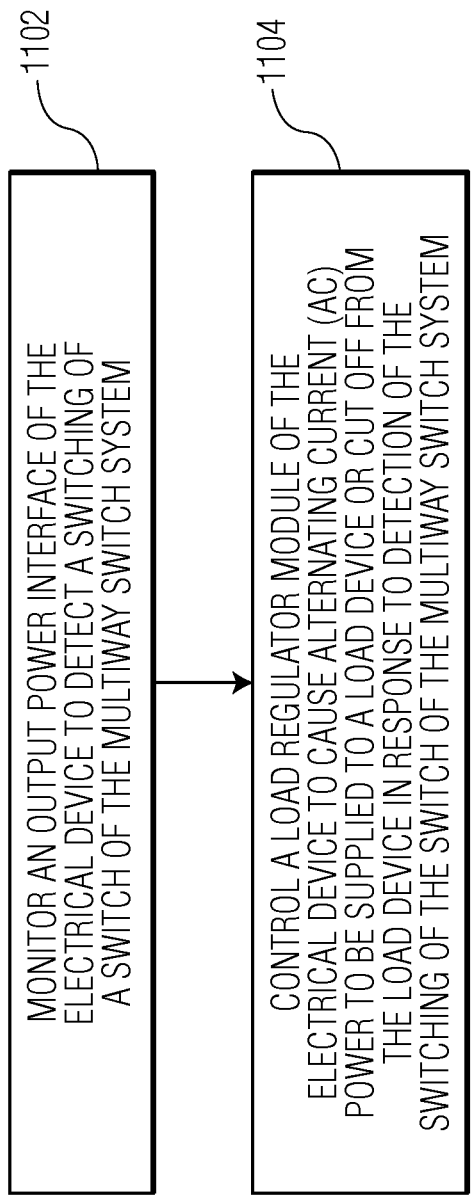
FIG. 11 is a process flow diagram that illustrates a method for operating an electrical device that is installed within an electrical gang/patress box for use with a multiway switch system in accordance with another embodiment of the invention.

FIG. 11 is a process flow diagram that illustrates a method for operating an electrical device that is installed within an electrical gang/patress box for use with a multiway switch system in accordance with an embodiment of the invention. The electrical device may be the same as or similar to the electrical device 100 depicted in FIG. 1, the electrical device 200 depicted in FIG. 2, the electrical device 600 depicted in FIG. 6, the electrical device 900 depicted in FIG. 9A, and/or the electrical device 1000 depicted in FIG. 10. The electrical gang/patress box may be the same as or similar to the electrical gang/patress box 102, 122, 202, 252, 262, 902, 952, 962, 1002, 1052, or 1062. The load device may be the same as or similar to the load device 110 depicted in FIG. 1, the load device 210 depicted in FIG. 2, the load device 910 depicted in FIG. 9A, and/or the load device 1010 depicted in FIG. 10. The multiway switch system may be the same as or similar to the multiway switch system 215 depicted in FIG. 2, the multiway switch system 915 depicted in FIG. 9A, and/or the multiway switch system 1015 depicted in FIG. 10. At block 1102, an output power interface of the electrical device is monitored to detect a switching of a switch of the multiway switch system. At block 1104, a load regulator module of the electrical device is controlled to cause alternating current (AC) power to be supplied to a load device or cut off from the load device in response to detection of the switching of the switch of the multiway switch system.

Figure 12:
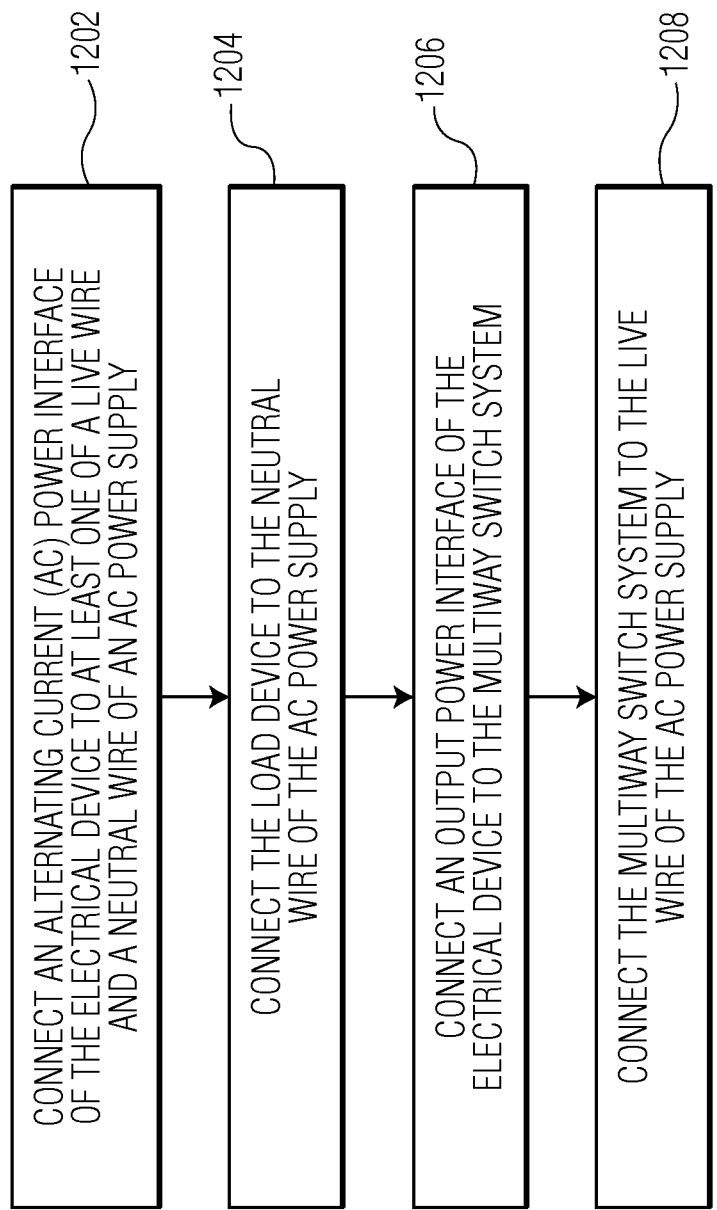
FIG. 12 is a process flow diagram that illustrates a method for connecting an electrical device with a load device and a multiway switch system for controlling the load device in accordance with another embodiment of the invention.

FIG. 12 is a process flow diagram that illustrates a method for connecting an electrical device with a load device and a multiway switch system for controlling the load device in accordance with an embodiment of the invention. The electrical device may be the same as or similar to the electrical device 100 depicted in FIG. 1, the electrical device 200 depicted in FIG. 2, the electrical device 600 depicted in FIG. 6, the electrical device 900 depicted in FIG. 9A, and/or the electrical device 1000 depicted in FIG. 10. The electrical gang/patress box may be the same as or similar to the electrical gang/patress box 102, 122, 202, 252, 262, 902, 952, 962, 1002, 1052, or 1062. The load device may be the same as or similar to the load device 110 depicted in FIG. 1, the load device 210 depicted in FIG. 2, the load device 910 depicted in FIG. 9A, and/or the load device 1010 depicted in FIG. 10. The multiway switch system may be the same as or similar to the multiway switch system 215 depicted in FIG. 2, the multiway switch system 915 depicted in FIG. 9A, and/or the multiway switch system 1015 depicted in FIG. 10. At block 1202, an alternating current (AC) power interface of the electrical device is connected to at least one of a live wire and a neutral wire of an AC power supply. At block 1204, the load device is connected to the neutral wire of the AC power supply. At block 1206, an output power interface of the electrical device is connected to the multiway switch system. At block 1208, the multiway switch system is connected to the live wire of the AC power supply.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An electrical device for use with a multiway switch system, the electrical device comprising:
    an alternating current (AC) power interface configured to connect to at least one of a live wire and a neutral wire of an AC power supply;
    a load regulator module configured to regulate a load device that is connected to the neutral wire of the AC power supply;
    an output power interface configured to connect to the multiway switch system and to output a voltage to a switch of the multiway switch system; and
    a microcontroller module configured to control the load regulator module in response to a switching of the multiway switch system,
    where in the microcontroller analyzes the waveform from the multiway switch system to account for jitter in the switch.

2. The electrical device of claim 1, wherein the electrical device further comprises a housing configured to fit within an electrical gang/patress box.

3. The electrical device of claim 2, wherein the electrical device has dimensions that are smaller than dimensions of the electrical gang/patress box.

4. The electrical device of claim 2, wherein the AC power interface is accessible from within the electrical gang/patress box, and wherein the electrical device is installed within the electrical gang/patress box.

5. The electrical device of claim 2, wherein the electrical device has dimensions that are around 52×49×18.5 millimeters, and wherein the electrical gang/patress box has dimensions in the range of between 2.375×4.5×1.5 millimeters and 2.375×4.5×2.5 millimeters.

6. The electrical device of claim 1, wherein the AC power interface is further configured to connect to the live wire and to the neutral wire of an AC power supply.

7. The electrical device of claim 1, further comprising an AC to direct current (DC) transformer configured to transform an AC power signal from the AC power supply into a DC power signal.

8. The electrical device of claim 7, wherein the voltage of the AC power signal is around 120V or around 230V, and wherein the voltage of the DC voltage signal is less than about 36V.

9. The electrical device of claim 1, wherein the load regulator module is configured to cause AC power to be supplied to the load device or cut off from the load device in response to the switching of the multiway switch system.

10. The electrical device of claim 9, wherein the microcontroller module is configured to monitor the output power interface to detect whether a movable switch arm the multiway switch system is toggled between stationary switch contacts of the multiway switch system.

11. The electrical device of claim 10, wherein the microcontroller module is configured to detect a rising edge and a subsequent falling edge of the voltage at the output power interface.

12. The electrical device of claim 9, wherein the load regulator module comprises an electrical relay switch configured to close or open.

13. The electrical device of claim 9, wherein the load regulator module comprises a Triode for Alternating Current (TRIAC) circuit configured to be activated or deactivated when a movable switch contact of the multiway switch system is toggled between stationary switch contacts of the multiway switch system.

14. The electrical device of claim 1, wherein the microcontroller module is configured to implement wireless communications.

15. The electrical device of claim 1, wherein the multiway switch system comprises at least one single-pole, double-throw (SPDT) switch.

16. The electrical device of claim 1, wherein the multiway switch system comprises at least one double-pole, double-throw (DPDT) switch.

17. A method for connecting an electrical device with a load device and a multiway switch system for controlling the load device, the method comprising:
    connecting an alternating current (AC) power interface of the electrical device to at least one of a live wire and a neutral wire of an AC power supply;
    connecting the load device to the neutral wire of the AC power supply; connecting an output power interface of the electrical device to the multiway switch system; and
    connecting the multiway switch system to the live wire of the AC power supply;
    analyzing the waveform from the multiway switch system to account for jitter in the switch.

* * * * *